United States Patent
Ayukawa et al.

(10) Patent No.: US 7,554,872 B2
(45) Date of Patent: Jun. 30, 2009

(54) SEMICONDUCTOR DEVICE INCLUDING MULTI-CHIP

(75) Inventors: Kazushige Ayukawa, Kokubunji (JP); Seiji Miura, Hachioji (JP); Yoshikazu Saitou, Hamura (JP)

(73) Assignee: Renesas Technology Corp., Tokyo (JP)

( * ) Notice: Subject to any disclaimer, the term of this patent is extended or adjusted under 35 U.S.C. 154(b) by 1103 days.

(21) Appl. No.: 11/037,088

(22) Filed: Jan. 19, 2005

(65) Prior Publication Data

US 2005/0128853 A1  Jun. 16, 2005

Related U.S. Application Data

(63) Continuation of application No. 10/411,237, filed on Apr. 11, 2003, now Pat. No. 6,847,575, which is a continuation of application No. 10/140,945, filed on May 9, 2002, now Pat. No. 6,587,393, which is a continuation of application No. 09/897,503, filed on Jul. 3, 2001, now Pat. No. 6,411,561, which is a continuation of application No. 09/803,958, filed on Mar. 13, 2001, now Pat. No. 6,392,950.

(30) Foreign Application Priority Data

May 26, 2000  (JP)  .............................. 2000-161123

(51) Int. Cl.
  *G11C 8/00*  (2006.01)
(52) U.S. Cl. ................ 365/230.03; 365/222; 365/233.5; 365/236
(58) Field of Classification Search ............ 365/230.03, 365/222, 233.5, 236
See application file for complete search history.

(56) References Cited

U.S. PATENT DOCUMENTS

| | | | | |
|---|---|---|---|---|
| 5,278,796 A | * | 1/1994 | Tillinghast et al. | .......... 365/211 |
| 5,781,468 A | | 7/1998 | Matsuo et al. | |
| 5,802,555 A | * | 9/1998 | Shigeeda | .................... 711/106 |
| 5,999,474 A | | 12/1999 | Leung et al. | |
| 6,046,953 A | | 4/2000 | Kiehl et al. | |
| 6,094,704 A | | 7/2000 | Martin et al. | |

(Continued)

FOREIGN PATENT DOCUMENTS

EP  566306 A2  10/1993

(Continued)

OTHER PUBLICATIONS

Sharp Data Sheet, "LRS 1337 Stacked Chip 32M Flash Memory and 4M SRAM", 1999, pp. 1-24.

(Continued)

*Primary Examiner*—Son Dinh
(74) *Attorney, Agent, or Firm*—Mattingly & Malur, PC

(57) ABSTRACT

In order to implement a memory having a large storage capacity and a reduced data retention current, a non-volatile memory, an SRAM, a DRAM, and a control circuit are modularized into one package. The control circuit conducts assignment of addresses to the SRAM and DRAM, and stores data that must be retained over a long period of time in the SRAM. In the DRAM, a plurality of banks are divided into two sets, and mapped to the same address space, and sets are refreshed alternately. A plurality of chips of them are stacked and disposed, and wired by using the BGA and chip-to-chip bonding.

6 Claims, 23 Drawing Sheets

U.S. PATENT DOCUMENTS

| | | |
|---|---|---|
| 6,157,080 A | 12/2000 | Tamaki et al. |
| 6,324,113 B1 | 11/2001 | Tomita |
| 6,339,817 B1 | 1/2002 | Maesako et al. |

FOREIGN PATENT DOCUMENTS

| | | |
|---|---|---|
| JP | 5-299616 | 11/1993 |
| JP | 8-305680 | 11/1996 |
| JP | 10-11348 | 1/1998 |
| JP | 11-204721 | 7/1999 |
| JP | 11-219984 | 8/1999 |

OTHER PUBLICATIONS

A. P. Chandrakasan et al, "Low Power Digital CMOS Design", Kluwer Academic Publishers, 1995, pp. 247-249.

D. B. Tuckerman et al, "Laminated Memory: A New 3-Dimensional Packaging Technology for MCMs", IEEE, San Jose, CA, 1994, pp. 58-63.

* cited by examiner

FIG. 5
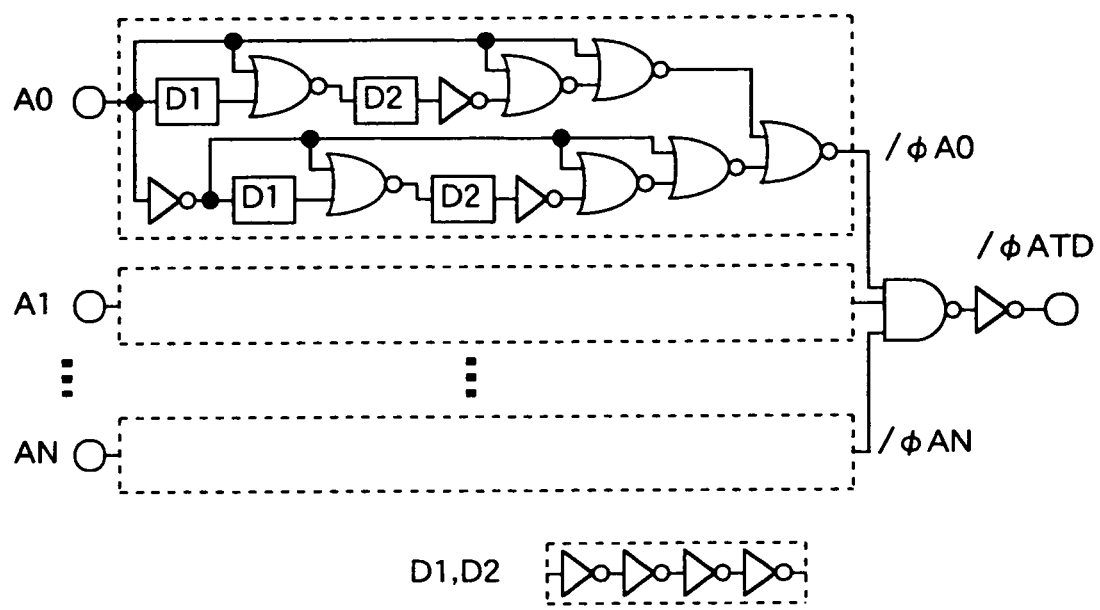
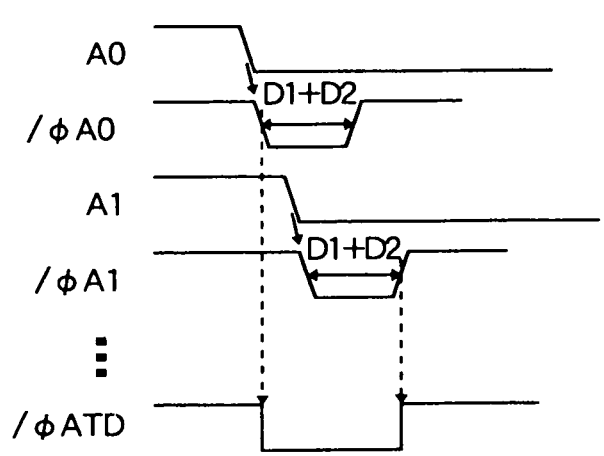

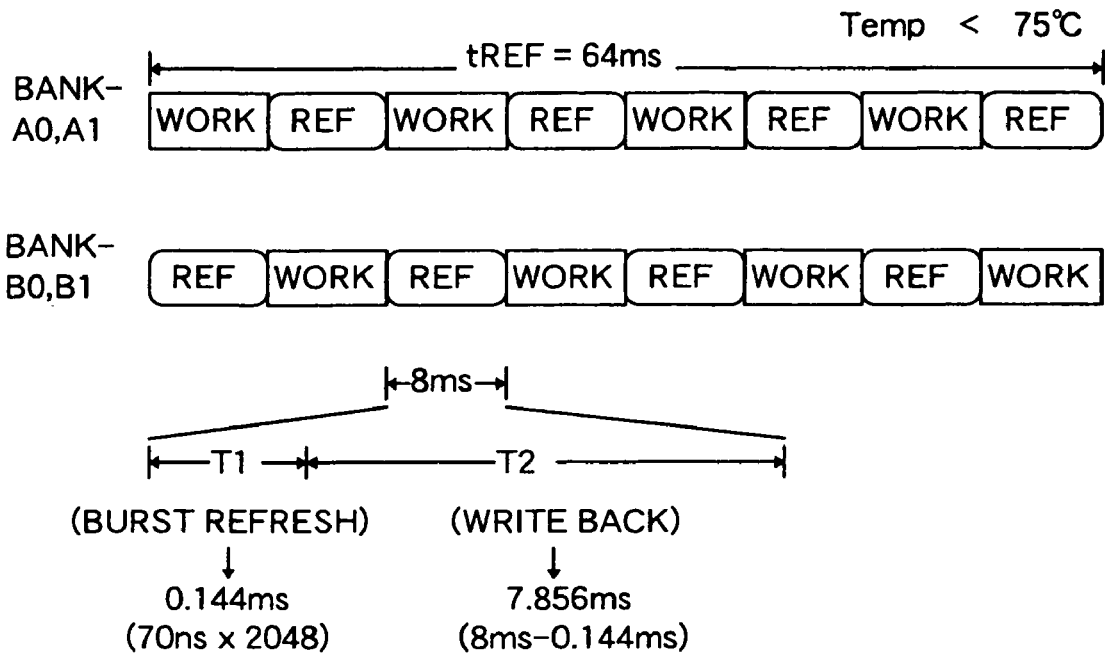
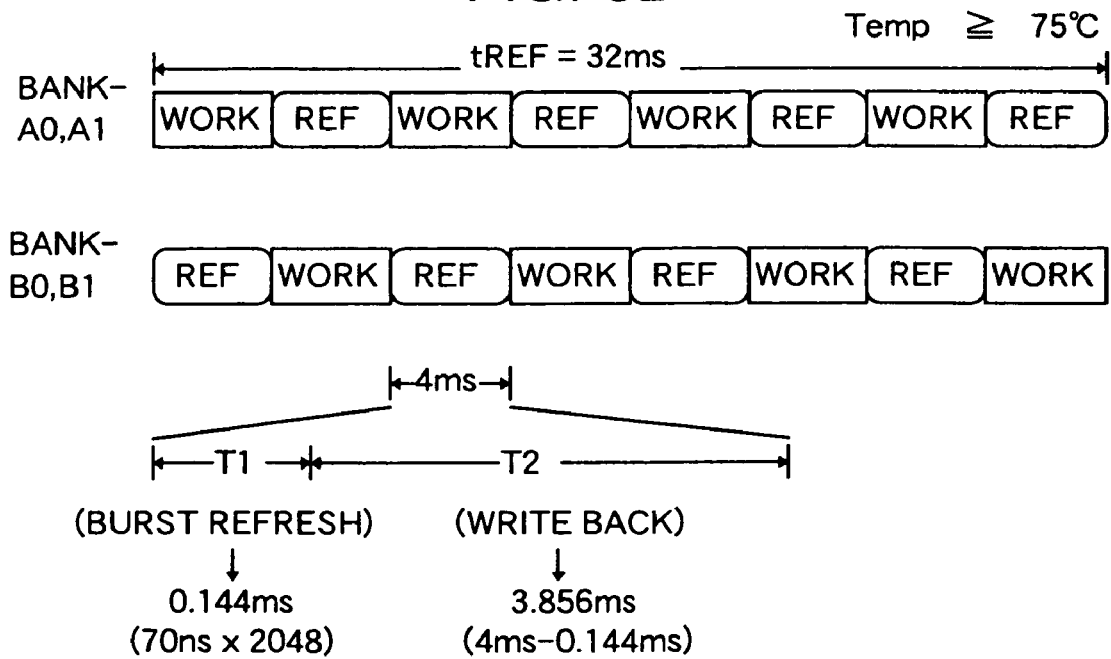

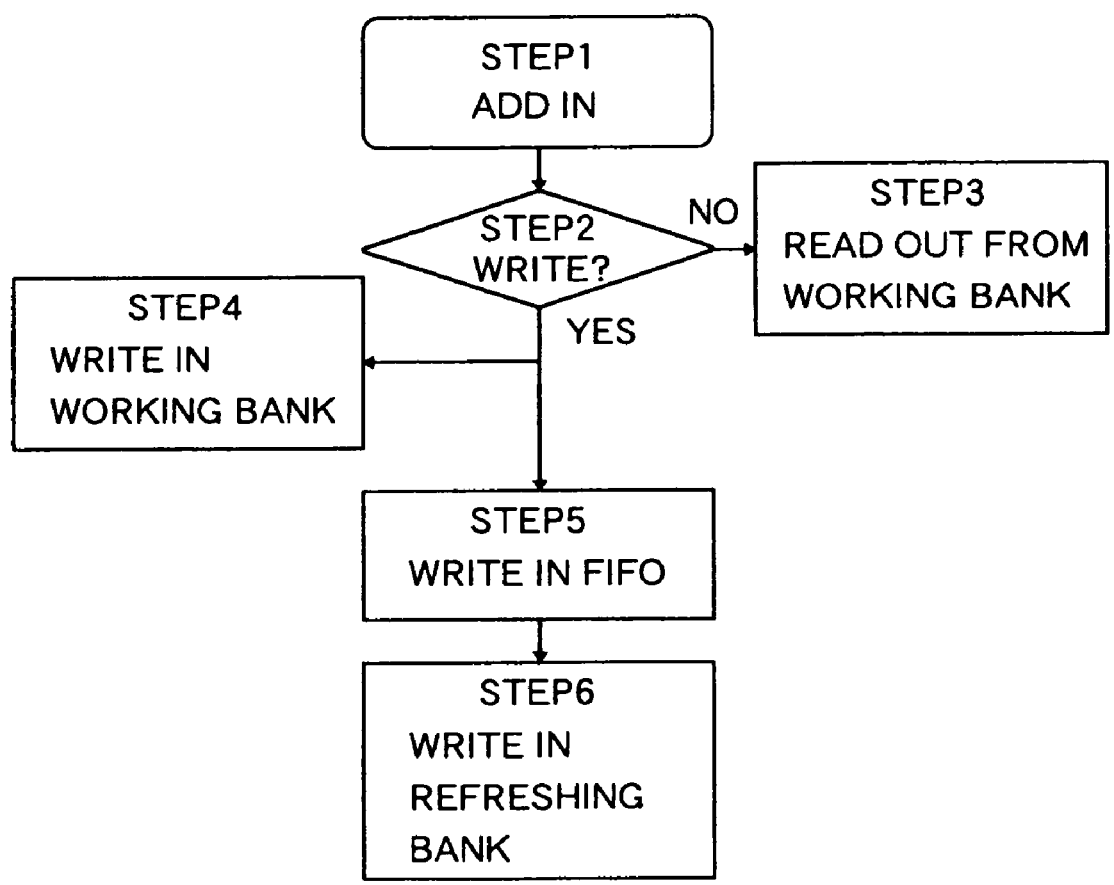

US 7,554,872 B2

SEMICONDUCTOR DEVICE INCLUDING MULTI-CHIP

This is a continuation of U.S. Ser. No. 10/411,237, filed Apr. 11, 2003 (now allowed), which a continuation application of U.S. Ser. No. 10/140,945, filed May 9, 2002 (now U.S. Pat. No. 6,587,393); which is a continuation application of U.S. Ser. No. 09/897,503, filed Jul. 3, 2001 (now U.S. Pat. No. 6,411,561); which is a continuation application of U.S. Ser. No. 09/803,958, filed Mar. 13, 2001 (now U.S. Pat. No. 6,392,950).

BACKGROUND OF THE INVENTION

The present invention relates to a combined type semiconductor memory module, and in particular to a DRAM refresh method.

A list of documents referred to herein is as follows. The documents will be referred to by using a document number.

Document 1: LRS1337 Stacked Chip 32M Flash Memory and 4M SRAM Data Sheet (retrieved on Apr. 21, 2000), Internet <URL:http://www.sharpsma.com/index.html>

Document 2: JP-A-11-219984 (laid open in Aug. 10, 1998) (corresponding to U.S. Pat. No. 6,157,080 published in Dec. 5, 2000)

Document 3: JP-A-5-299616 (laid open in Nov. 12, 1993) (corresponding to EUROPEAN PATENT APPLICATION Publication number 566,306 laid open in Oct. 20, 1993)

Document 4: JP-A-8-305680 (laid open in Nov. 22, 1996)

Document 5: JP-A-11-204721 (laid open in Jul. 30, 1999)

Document 6: JP-A-10-11348 (laid open in Jan. 26, 1998)

In the document 1, there is described a combined type semiconductor memory module including a flash memory and an SRAM sealed integrally with a BGA (ball grid array) type package by using a stacked chip configuration. The flash memory and the SRAM share address input terminals and data input and output terminals with respect to input and output electrodes of an FBGA (Fine-pitch Ball Grid Array) type package. However, they have independent control terminals, respectively.

In the document 2, there is described a combined type semiconductor memory module including a flash memory and an SRAM integrally sealed to a BGA (ball grid array) type package by using a stacked chip. Signal pads of the flash memory are subject to face down bonding to a circuit substrate of the BGA package via solder bumps. Signal pads of the SRAM mounted on the flash memory are connected to the substrate by wire bonding.

With reference to FIG. 17 of the document 3, there is described a combined type semiconductor memory module including a flash memory chip and a DRAM chip integrally sealed to a lead frame type package. Furthermore, with reference to FIG. 1, there is described such a flash memory and a DRAM that address input terminals, data input and output terminals, and control terminals are shared for inputting and outputting with respect to input and output electrodes of the package.

In the document 4, there is described a semiconductor device. In this semiconductor device, an SRAM chip is mounted on a die pad. On the SRAM chip, a flash memory chip and a microcomputer chip connected via a bump electrode are mounted. Those chips are sealed integrally with a lead terminal type package to form the semiconductor device.

With reference to FIG. 15 of the document 5, there is described such a semiconductor device that two small-sized chips are mounted on the back of one large-sized chip via an insulation plate and those chips are integrally sealed to a lead frame type package. It is described that there are a flash memory chip, a DRAM chip, and an ASIC (Application Specific IC) as a combination of chips that can be mounted and consequently a memory embedded logic LSI is implemented by one package.

In the document 6, there is described a technique for avoiding collision between access from the outside and refresh of the DRAM by providing two DRAM blocks, storing the same data in duplicate, and staggering two DRAM blocks in refresh timing. This control is conducted by a DRAM controller. This DRAM controller issues physically independent address signals and control signals to the two DRAM blocks.

SUMMARY OF THE INVENTION

Prior to the present invention, the present inventors examined a mobile phone and a combined type memory module that is to be used for the mobile phone and that includes a flash memory and an SRAM mounted on one package. Besides the OS (operation system) of the mobile phone system, a communication program and application programs are stored in the flash memory. On the other hand, telephone numbers, an address book, and a ringing tone are stored in the SRAM. Besides, a work area which is temporarily used at the time of execution of an application is secured in the SRAM.

In order to retain data to be stored, such as the telephone numbers and the address book, power supply for retaining the data is connected to the SRAM even when power supply of the mobile phone is in the off state. For retaining the data over a long period of time, it is desirable that the data retention current of the SRAM is small. However, it is expected that with an increase of the functions added to the mobile phone (downloading of music and games) the work area used by the applications becomes large and an SRAM having a larger storage capacity is needed. In particular, enhancement in the function of recent mobile phones is remarkable. It has been found that it is gradually becoming difficult to cope with the function enhancement by using an SRAM having a larger capacity. In other words, an increase in the capacity of the SRAM has the following problem. The problem of the large capacity SRAM is that the data retention current is increased by the amount of increase of the storage capacity and in addition the data retention current is increased by increase of the gate leakage current. The reason is as follows: if advanced scaling technologies are introduced and the oxide insulation films of MOS transistors are made thinner in order to implement large capacity SRAMs, then a tunnel current flows from the gate to the substrate and the data retention current is increased thereby.

Therefore, one of objects of the present invention is to implement a memory that is larger in storage capacity and smaller in data retention current.

According to one aspect of the present invention, a flash memory, a static random access memory (SRAM), and a dynamic random access memory (DRAM) having a plurality of memory banks are incorporated into one sealing member or package. In the dynamic random access memory (DRAM), reading/writing is conducted by a command synchronized to a clock. On the sealing member, there are provided electrodes for conducting wiring to semiconductor chips and electrodes for making connections between the sealing member and the outside of the sealing member.

In order to hide refresh of the DRAM from the outside of the semiconductor device at this time, a memory controller is connected to the DRAM including two or more banks in one chip. The memory controller controls memory access to the DRAM. In the case where memory access has been conducted by the memory controller in the first interval, the first bank may be accessed. In the case where memory access has been conducted by the memory controller in the second interval, the second bank may be accessed.

A dynamic random access memory (DRAM) having a plurality of memory banks is used. In the dynamic random access memory (DRAM), reading/writing is conducted by a command synchronized to a clock. A plurality of memory banks are assigned to a first memory block and a second memory block having the memory capacity. Memory access is conducted alternately in the first interval and the second interval. In the first interval, a read/write command directed to the DRAM is executed on the first memory block, and on the second memory block, refresh operation is executed preferentially. In the second interval, a read/write command directed to the DRAM is executed on the second memory block, and on the first memory block, refresh operation may be executed preferentially.

BRIEF DESCRIPTION OF THE DRAWINGS

FIG. 5 is a diagram showing an example of a configuration of an ATD circuit or a DTD circuit illustrated in FIG. 2;

FIGS. 6A and 6B are diagrams showing examples of a refresh system of a DRAM;

FIG. 7 is a flow chart showing a flow of processing conducted when a DRAM is accessed;

DESCRIPTION OF THE EMBODIMENTS

Figure 1:
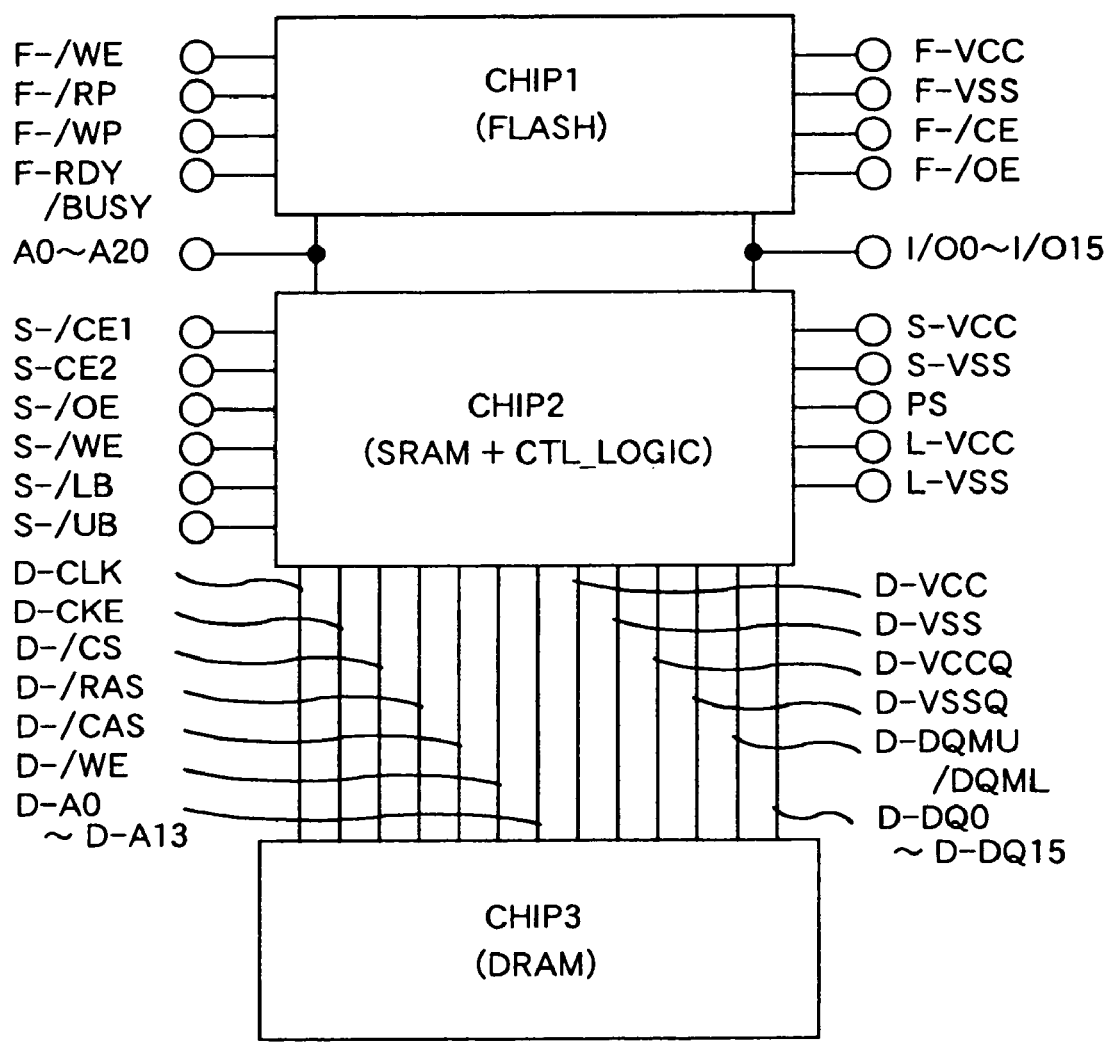
FIG. 1 is a configuration diagram of a memory module according to an embodiment of the present invention.

Hereafter, embodiments of the present invention will be described in detail by referring to the drawing. Circuit elements forming respective blocks of the embodiment are not especially limited, but they are formed on one semiconductor substrate, such as monocrystalline silicon, by a known integrated circuit technique of CMOS (complementary MOS).

Embodiment 1

FIG. 1 shows a first embodiment of a memory module that is an example of a semiconductor integrated circuit device according to an embodiment of the present invention. The present memory module is formed of three chips. Hereafter, respective chips will be described.

First, CHIP1 (FLASH) is a nonvolatile memory. A ROM (read only memory), an EEPROM (electrically erasable and programmable ROM), or a flash memory can be used as the nonvolatile memory. The present embodiment will be described by taking a flash memory as an example. A static random access memory (SRAM) and a control circuit (CTL_LOGIC) are integrated in CHIP2 (SRAM+CTL_LOGIC). The control circuit controls the SRAM integrated in the CHIP2 and CHIP3. The CHIP3 (DRAM) is a dynamic random access memory (DRAM). As the DRAMs, there are various kinds, such as EDO, SDRAM, and DDR, depending upon differences in internal configuration and interface. Any DRAM can be used in the present memory. However, the present embodiment will be described by taking an SDRAM as an example.

From the outside, address signals (A0 to A20) and command signals (S-/CE1, S-CE2, S-/OE, S-/WE, S-/LB, S-/UB, F-/WE, F-/RP, F-/WP, F-RDY/BUSY, F-/CE, and F-/OE) are inputted to this memory module. Power supply is fed through S-VCC, S-VSS, F-VCC, F-VSS, L-VCC and L-VSS. I/O0 to I/O15 are used for inputting and outputting data. Address signal lines and data input/output lines are connected to CHIP1 (FLASH) and CHIP2 (SRAM+CTL_LOGIC) in common. The CHIP2 supplies a clock (D-CLK), an address (D-A0 to D-A13), a command (D-CKE, D-/CS, D-/RAS, D-/CAS, D-/WE, D-DQMU/DQML), data for DRAM (D-DQ0 to D-DQ15), and power supplies (D-VCC, D-VSS, D-VCCQ, D-VSSQ). One of features of the input/output nodes between this memory module and the outside is that signal terminals for DRAM interface are made directly invisible. While a BGA (ball grid array) type package of the present invention will be described later with reference to FIG. 16 showing an embodiment, therefore, signal terminals for controlling the DRAM are typically not provided in terminals used as external terminals in this package. As a result, the existence of the DRAM is hidden, and the merit of an increase of the storage capacity can be given. The user need not take DRAM refresh into consideration. In the case where the number of signal terminals of the BGA type package is very large and enough to spare, however, control terminals of the DRAM may be pulled out to the outside in parallel mainly for the purpose of test conducted by a manufacturer at the time of fabrication. By doing so, it becomes possible for the manufacturer to conduct defect analysis rapidly. As a matter of course, this function is not usually opened to the user.

Respective command signals will now be described briefly. S-/CE1 and S-CE2 inputted to the CHIP2 are chip enable signals. S-/OE is an output enable signal. S-/WE is a write enable signal. S-/LB is a lower byte selection signal. S-/UB is an upper byte selection signal. F-/WE inputted to the CHIP1 is a write enable signal. F-/RP is a reset/deep power down signal. F-/WP is a write protect signal. F-RDY/BUSY is a ready/busy output signal. F-/CE is a chip enable signal. F-/OE is an output enable signal and is used to control the flash memory.

In the present memory module, it is possible to access the flash memory, SRAM and DRAM by using the common address lines (A0 to A20) and data input/output lines (I/O0 to I/O15).

When accessing the flash memory (CHIP1), required signals among the command signals F-/WE, F-/RP, F-/WP, F-RDY/BUSY, F-/CE, and F-/OE are made active besides the address lines (A0 to A20). When accessing the SRAM (CHIP2) or DRAM (CHIP3), required signals among the command signals S-/CE1, S-CE2, S-/OE, S-/WE, S-/LB and S-/UB are made active besides the address lines (A0 to A20). Either access is conducted by using the so-called SRAM interface system.

Access to the SRAM and access to the DRAM are discriminated by the address value. On the basis of the inputted address value, the control circuit (CTL_LOGIC) judges the access destination. The range of address that becomes an access to the SRAM and the range of address that becomes an access to the DRAM are determined by previously setting a value in a register provided in the control circuit (CTL_LOGIC).

When accessing the DRAM, the control circuit (CTL_LOGIC) generates an address signal and command signals required for accessing the DRAM, and accesses the DRAM. In the case of a read access, data read out from the DRAM is read out from data I/O for DRAM (D-DQ0 to D-DQ15) temporarily into the control circuit (CTL_LOGIC), and then outputted to data input/output lines (I/O0 to I/O15) of the memory module. In the case of write access, write data is inputted from the data input/output lines (I/O0 to I/O15) of the memory module, and then inputted to the DRAM through the data I/O for DRAM (D-DQ0 to D-DQ15).

Power supply to the DRAM is fed from the L-VCC and L-VSS, and connected to D-VCC, D-VSS, D-VCCQ and D-VSSQ through the control circuit (CTL_LOGIC). Supply of power to the DRAM is controlled by a command signal PS, and it can be disconnected as occasion demands. When throwing in the disconnected DRAM power again, it is necessary to initialize the DRAM. The signal generation and timing control required to initialize the DRAM is conducted by the control circuit (CTL_LOGIC).

Furthermore, when refreshing the DRAM, the control circuit (CTL_LOGIC) can conduct it by periodically issuing a refresh command. In general, the refresh characteristics of the DRAM are aggravated when the temperature is high. By providing a thermometer in the control circuit (CTL_LOGIC) and narrowing the issue period of the refresh command, the DRAM can be used in a wider temperature range. On the contrary, when the temperature is low, power required for data retention can be reduced by widening the issue period of the refresh command.

In addition, the control circuit (CTL_LOGIC) retains one data in two different addresses of the DRAM and adjusts timing of conducting refresh. Thus the control circuit (CTL_LOGIC) hides the refreshing from the outside of the DRAM so as not to restrict access by the refresh operation.

According to the embodiment heretofore described, a large capacity memory module using an inexpensive general purpose DRAM can be implemented while following the SRAM interface system. In the memory module according to the present invention, a DRAM is used. Since refreshing required for the DRAM is executed within the module, however, the DRAM can be used without considering the refresh in the same way as the SRAM. Furthermore, by changing the refresh period executed within the module according to the temperature, it becomes possible to widen the use temperature range of the DRAM and reduce the power required for data retention. A large capacity memory module having a wide use temperature range can be implemented.

In addition, the refresh of the DRAM can be hidden from the outside of the DRAM by duplicating the data retention in the DRAM and adjusting the refresh timing. When accessing the present memory module, therefore, there is no need to adjust timing while taking the refresh into consideration. Accordingly, the present memory module can be used in the same way as the conventional memory module using only the SRAM. Without changing the conventional system, therefore, a large capacity memory module can be used.

Another object of the present invention is to implement a memory module having a small data retention current. This object can be achieved by disconnecting power supplied to the DRAM and retaining only data stored in the SRAM. By storing only data to be retained in the SRAM and stopping power supply to a memory for storing data that need not be retained, it is possible to retain only required data with a minimum data retention current.

Figure 2:
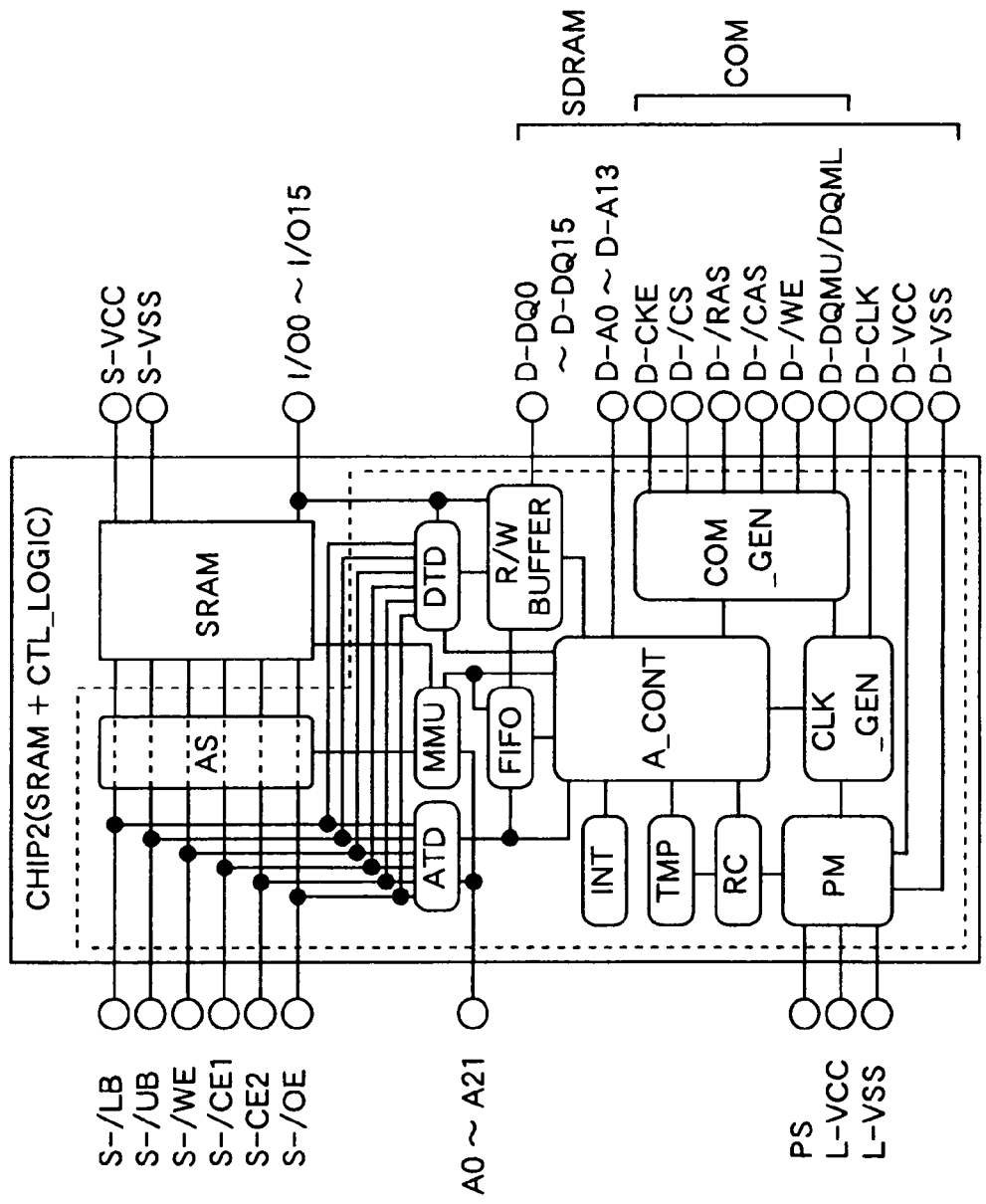
FIG. 2 is a block diagram showing an example of CHIP2 illustrated in FIG. 1.

FIG. 2 shows the CHIP2 (SRAM+CTL_LOGIC). The CHIP2 (SRAM+CTL_LOGIC) is formed of the SRAM and the control circuit (CTL_LOGIC). The integrated SRAM is an unsynchronous SRAM typically used heretofore. The control circuit (CTL_LOGIC) is a portion of the CHIP2 other than the SRAM and is shown as an area surrounded by a broken line. The control circuit (CTL_LOGIC) includes AS, MMU, ATD, DTD, FIFO, R/W BUFFER, A_CONT, INT, TMP, RC, PM, CLK_GEN and COM_GEN.

When an address is inputted from the outside, a memory management unit MMU converts the inputted address according to a preset value, and selects a memory to be accessed. If the SRAM is selected, then a command signal is sent to the SRAM by an access switch (AS) and the SRAM is accessed. An address transition detector circuit (ATD) detects changes in the address signal and the command signals, and outputs a pulse. A data transition detector circuit (DTD) detects changes in the data signal and the command signals, and outputs a pulse. A R/W BUFFER retains data temporarily for DRAM reading and writing. A first-in first-out memory FIFO is a first-in first-out buffer circuit, which temporarily retains data written into the DRAM and its address. An initializing circuit INT initializes the DRAM when power supply to the DRAM is started. A temperature measuring module (TMP) detects the temperature, and outputs a signal depending on the detected temperature to the RC and A_CONT. The RC is a refresh counter, which generates an address of refreshing according to the refresh period of the DRAM.

Furthermore, the refresh counter RC alters the refresh period according to the temperature in response to an output signal of the temperature measuring module (TMP). A power module (PM) conducts power supply to the control circuit (CTL_LOGIC) of the CHIP2 and the DRAM and control of the power supply. A clock generator (CLK_GEN) generates a clock and supplies it to the DRAM and the control circuit (CTL_LOGIC). A command generator (COM_GEN) generates a command required to access the DRAM. An access controller (A_CONT) conducts control of the whole operation of the CHIP2 (SRAM+CTL_LOGIC) and generates an address for accessing the DRAM.

For conducting memory access to the CHIP2 (SRAM+CTL_LOGIC), interfacing is executed by using the unsynchronous SRAM system, which has been heretofore used in general. When an address (A0 to A21) is inputted to the CHIP2 (SRAM+CTL_LOGIC) from the outside, the address value is first converted by the MMU. The pattern of conversion is determined by a value previously inputted to a register within the MMU. It is determined on the basis of the converted address whether the access destination is SRAM or DRAM.

When accessing the SRAM, the MMU sends the converted address to the SRAM. At the same time, the MMU orders the address access switch (AS) to transfer the command. The address access switch (AS) transfers the command to the SRAM, and access to the SRAM is started. As for the ensuing operation, access to the so-called unsynchronous SRAM is conducted.

Operation of respective blocks of the control circuit conducted when executing read access to the DRAM will hereafter be described. First, the address inputted from the outside and converted by the MMU and the command sensed by the ATD are sent to the A_CONT. The A_CONT judges the execution of the access to the DRAM on the basis of the sent address and command, and orders the COM_GEN to issue a command to the DRAM. Furthermore, the A_CONT converts the address received from the MMU to an address for the DRAM, and outputs the address for the DRAM to the DRAM. In synchronism with the clock generated by the CLK_GEN, the COM_GEN issues a command to the DRAM. Upon receiving the command and the address, the DRAM outputs data. The outputted data is transferred to the I/O0 to I/O15 via the R/W BUFFER. The read access is thus finished.

When executing write access to the DRAM, the address inputted from the outside and converted by the MMU, the command sensed by the ATD, the command and data sensed by the DTD are sent to the A_CONT. The A_CONT judges execution of access to the DRAM on the basis of the sent address and command, and orders the COM_GEN to issue a command to the DRAM. Furthermore, the A_CONT converts the address received from the MMU to an address for the DRAM, and outputs the address for the DRAM to the DRAM. In synchronism with the clock generated by the CLK_GEN, the COM_GEN issues a command to the DRAM. Data to be written is inputted from the I/O0 to I/O15 and temporarily retained in the R/W BUFFER, then sent to the DRAM and written into the DRAM. In addition, the data thus written and the address are retained in the FIFO as well, and written into a different bank of the DRAM as well later.

Power supplied to the DRAM is controlled by the power module (PM). In some cases, it is desirable to reduce the consumption current of the device having the memory module mounted thereon according to the operation state. In such a case, the power module can stop the refresh conducted by the refresh counter according to, for example, the command signal PS, and thereby reduce power required to refresh the DRAM. In the case where it is desirable to further reduce the consumption power, power supplied to the DRAM can be disconnected within the memory module. In this case, the power module stops power to the D-VCC supplied to the DRAM according to the command signal PS outputted by the device.

In the case where it is desirable to further reduce the power consumption, the power module can stop supply of power to a portion of the CHIP2 (SRAM+CTL_LOGIC) concerning the memory access to the DRAM, according to the command signal PS. In this state, it is possible to connect power supply to, for example, only the MMU and AS of the CHIP2 (SRAM+CTL_LOGIC) besides the SRAM, bring the MMU and AS into the operation state, and bring about such a mode as to execute only access to the SRAM.

In addition, it is also possible to bring about such an operation state as to conduct only date retention of the SRAM by the command PS. In such a case, power supplies other than power supplies (S-VCC and S-VSS) connected to the SRAM are disconnected and access to a memory is inhibited. In this state, the memory module retains data stored in the SRAM.

For re-activating the DRAM stopped in operation by temporarily stopping the power supply, it is necessary to initialize the DRAM in addition to resuming the power supply. The initializing method is typical. In the memory module, however, the initializing circuit (INT) orders the access controller (A_CONT) to execute an initializing procedure, and initialization is executed.

Also in the case where the refresh of the DRAM is stopped, initialization of the DRAM is required for making the DRAM operate again. In this case as well, the initializing circuit (INT) directs an initializing procedure to the access controller (A_CONT) and initialization is executed.

The refresh counter RC outputs a refresh address in accordance with the refresh period of the DRAM, and requests the access controller to execute the refresh. In response to the request from the refresh counter, the access controller issues a refresh command while arbitrating with respect to the access to the DRAM from the outside, and conducts the DRAM refresh.

When using the memory module in a high temperature state, it becomes necessary to shorten the refresh period of the DRAM and conduct the refresh frequently. In such a case, the temperature measuring module (TMP) detects the temperature, and notifies the temperature to the refresh counter and the access controller. When the temperature becomes high, the refresh counter changes the refresh period so as to make it shorter, and outputs the refresh address.

The clock (D-CLK) required for the operation of the DRAM is generated by the clock generator (CLK_GEN). The clock generator supplies the clock to respective blocks within the control circuit as well as the DRAM. In the case where the DRAM operates in synchronism with the clock, the command issue of the command generator (COM_GEN) is conducted in synchronism with the clock.

By stopping the refresh of the DRAM, the power consumption can be reduced. In the case where the power of the DRAM is disconnected and only the SRAM is accessed, operation with low power becomes possible although the storage capacity is small. In this case, it is also possible to further stop the power supplied to the control circuit required for DRAM access and thereby implement operation with further low power. Furthermore, by supplying power to only the SRAM and retaining only the data stored in the SRAM. Also when re-throwing in power to the DRAM, the DRAM initialization can be conducted by the control circuit, and consequently it is not necessary to execute the initialization procedure on the module from the outside. As a result, a memory module that reduces the power consumption can be implemented simply.

Figure 3A:
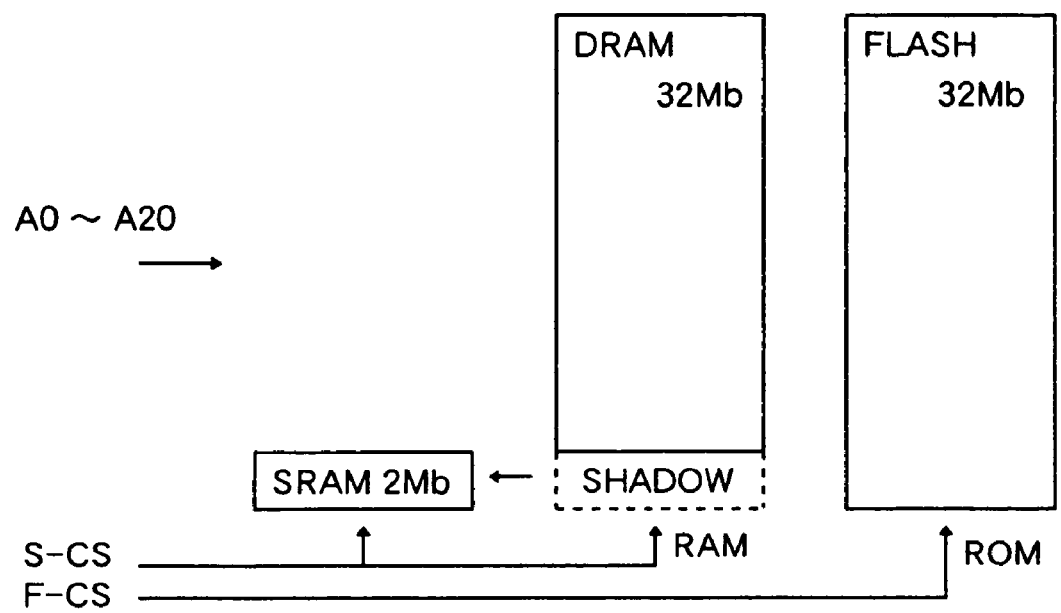
FIGS. 3A and 3B are diagrams showing examples of an address map of a memory module according to an embodiment of the present invention.
Figure 3B:
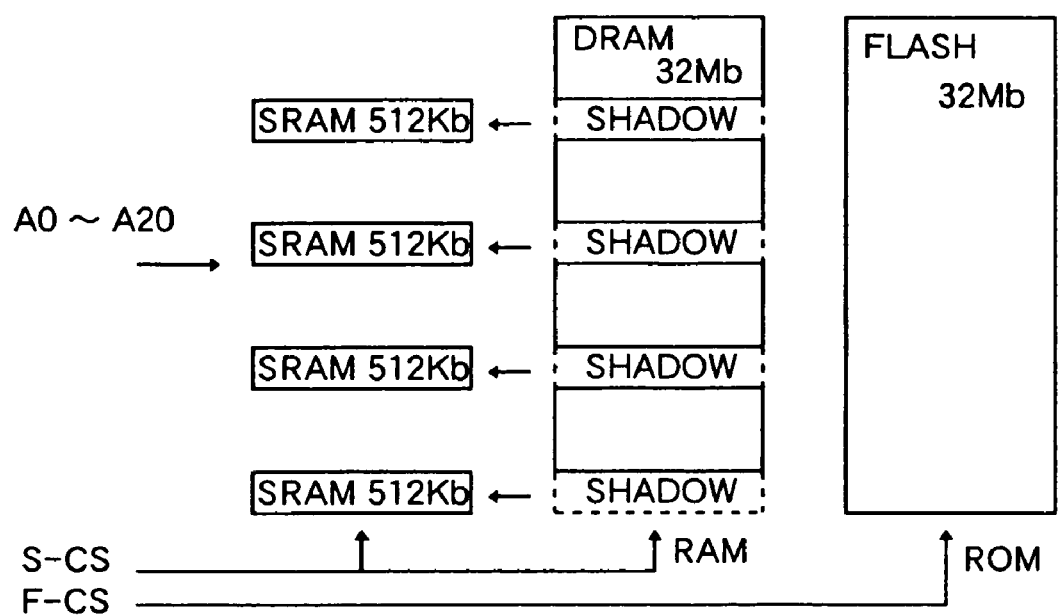

FIGS. 3A and 3B show examples of a memory map converted by the MMU. The present embodiment will now be described by taking a memory module having a storage area of 32 Mb in the nonvolatile memory, a data retention area of 2 Mb in the SRAM, and a storage area of 32 Mb in the DRAM, which is not restrictive, as an example. The address A0 to A20 inputted from the outside is used in common by the flash memory (CHIP1) and the CHIP2. For selection of the access destination, signals S-CS and F-CS for chip selection are used. If the signal F-CS has become active, then the CHIP1 is selected and access is conducted. If the signal S-CS has become active, then the CHIP2 is selected and access is conducted. The F-CS is a general term of the command signals F-/WE, F-/RP, F-/WP, F-RDY/BUSY, F-/CE and F-/OE. The S-CS is a general term of the command signals S-/CE1, S-/CE2, S-/OE, S-/WE, S-/LB and S-/UB. If the CHIP2 is selected as the access destination, then the MMU selects a memory to be accessed, according to the address.

In the example of the memory map shown in FIG. 3A, the SRAM area is set so as to be concentrated to a part of an address space. The address space of the SRAM overlaps in the address space of the DRAM. Access to the overlapping address space is conducted for the SRAM. The DRAM area existing in the same address space becomes a shadow area, which is not accessed.

On the other hand, in the example shown in FIG. 3B, SRAM areas are set so as to be distributed into a plurality of address spaces. In this case as well, the address space of the SRAM overlaps in the address space of the DRAM. Access to the overlapping address space is conducted for the SRAM. In this example, the SRAM areas are set by taking 512 kb as the unit. This is set equal to the writing or erasing unit of the FLASH memory. This aims at facilitating handling conducted by the OS and a program by aligning the management unit of the address space with that of the FLASH memory.

In this way, the MMU can assign the SRAM areas and DRAM areas to specified address spaces. Especially when it is desirable to reduce the data retention current, it is possible to assign address spaces for storing data to be retained to SRAM-areas and stop power supply to the DRAM. Owing to this method, a memory module requiring a small data retention current can be implemented.

Figure 4A:
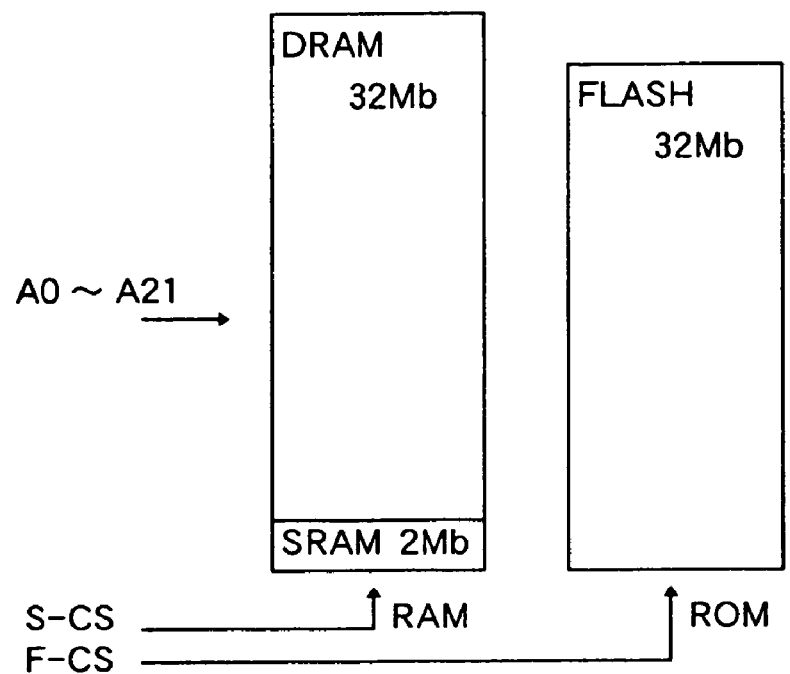
FIGS. 4A and 4B are diagrams showing examples of an address map of a memory module according to an embodiment of the present invention.
Figure 4B:
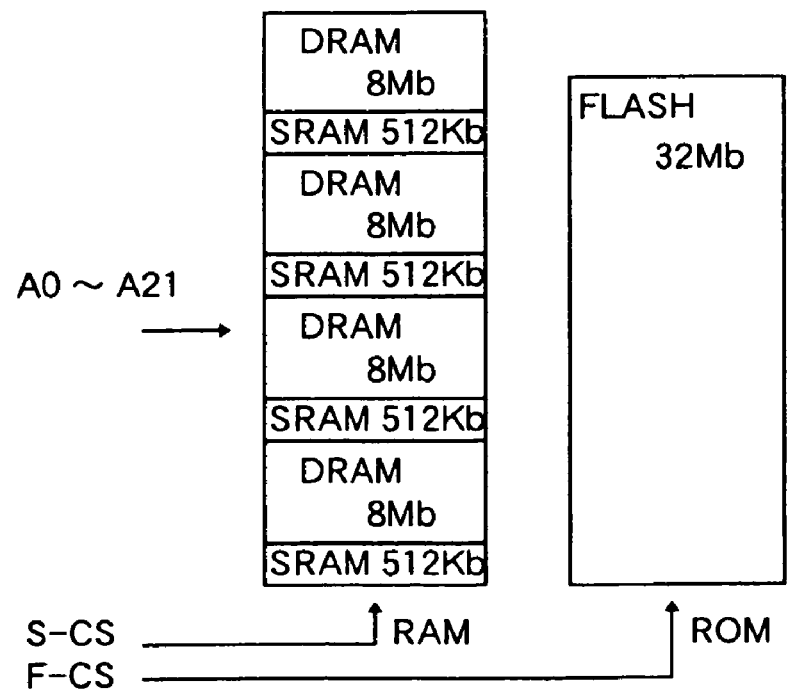

FIGS. 4A and 4B show different examples of the memory map converted by the MMU.

In the example of the memory map shown in FIG. 4A, the SRAM area is set so as to be concentrated to a part of an address space. The example of the memory map shown in FIG. 4A differs from that shown in FIG. 3A in that there is no overlapping between the address space of the SRAM and the address space of the DRAM. Since a shadow area is not generated in the DRAM, the memory space of the DRAM can be utilized efficiently. In FIG. 4B as well in the same way, there is no overlapping between the address space of the SRAM and the address space of the DRAM, unlike the example shown in FIG. 3B. Since the shadow area is not generated in the DRAM, the memory space of the DRAM can be used effectively. By using the memory map shown in FIG. 4A or 4B, the address space increases by approximately 2 Mb. This can be coped with by adding an address line A21. In this way, the storage area of the DRAM can be used more effectively in the memory map shown in FIG. 4A or 4B.

FIG. 5 shows a configuration example of the ATD circuit and its operation waveform. The address transition detector circuit (ATD) senses a value change of address signal lines and generates a pulse. Each of characters D1 and D2 used in the circuit diagram denotes a delay element for generating a delay. If a change occurs in address lines (A0 to AN), then the ATD outputs a pulse (/φA0 to /φAN) having a width equivalent to the sum of the delay of the delay element D1 and the delay of the delay element D2. Furthermore, by taking operation dispersion of individual address lines into consideration and generating a signal /φATD, which is obtained by adding these pulses, it is sensed that an address value appearing on the address lines has changed. As shown in FIG. 2, not only the address lines but also the command signals are connected to the ATD. The ATD thus detects that a new command has been inputted. The data transition detector circuit (DTD) has a configuration similar to that of the ATD. The DTD detects a change on the data lines and a command signal for writing, and recognizes write data and a write command.

Upon thus detecting unsynchronously changing SRAM interface signals by the ATD and DTD, the memory module starts its operation. By using these circuits, a memory module that operates on the basis of the unsynchronous SRAM interface can be implemented. Since unsynchronously changing signals pulsed and synchronized to the clock are sensed, it is also possible to use a memory device that conducts synchronous operation within the memory module.

FIGS. 6A and 6B show how the DRAM operates in time division in order to hide the refresh of the DRAM. By taking such a DRAM that one chip is formed of four banks, as an example, the DRAM operation will now be described. Four banks BANK-A0, BANK-A1, BANK-B0 and BANK-B1 are divided into two sets BANK-A0 and BANK-A1, and BANK-B0 and BANK-B1. The two sets are mapped to the same address space. In other words, a memory cell specified by one address exists in each of the two sets, and data are stored double redundantly.

FIG. 6A shows the operation of the DRAM when the temperature is below 75° C., which is the typical use temperature range of the DRAM. Typically, memory cells of the DRAM need to be refreshed once every 64 ms. The 64 ms is divided into 8 intervals each having a length of 8 ms. The set of the BANK-A0 and BANK-A1 and the set of the BANK-B0 and BANK-B1 alternately operate interval after interval. A WORK interval represented as WORK in FIG. 6A represents an interval that the bank set operates. During the first WORK interval, the set of the BANK-A0 and BANK-A1 is operating. If read access to the DRAM has been conducted, then readout is conducted from the set of the BANK-A0 and BANK-A1, which is in the WORK interval. If write access to the DRAM has been conducted, then writing into the set of the BANK-A0 and BANK-A1, which is in the WORK interval, is conducted and data thus written and the address are temporarily stored in the FIFO. The stored data is written into the set of the BANK-B0 and BANK-B1 as well in an interval T2. The interval T2 will be described later. While the BANK-A0 and BANK-A1 are in the WORK interval, the BANK-B0 and BANK-B1 are in a REF interval. In the REF interval, refresh is conducted for half an area of banks of the set of the BANK-B0 and BANK-B1. The REF interval is divided into a T1 interval and the T2 interval. During the T1 interval, refresh is conducted consecutively. During the T2 interval, data written during the REF interval is written back from the FIFO.

Assuming that the time required for the refresh is 70 ns per once, the time required for the refresh becomes 70 ns×2048 times, which is equal to 0.144 ms. Therefore, the interval T2 becomes 7.856 ms (=8 ms−0.144 ms). It is now assumed that the memory module is accessed once every 75 ns. If it is assumed that every access conducted during the REF interval is write access, then the maximum number of times thereof is 106,667 (=8 ms/75 ns). The time required for writing this into the DRAM is 7.47 ms (=106,667×70 ns), which is shorter than the T2 interval (7.856 ms). Even if refresh is conducted during the T1 interval, therefore, all of the write access conducted during the REF interval can be written back during the T2 interval.

Furthermore, it is also possible to execute the refresh in two banks simultaneously during the REF interval. In this case, the number of times of refresh executed in one bank during the T1 interval becomes the half, i.e., 1,024. If the T1 interval is shortened, then the storage capacity of the FIFO can be reduced, and in addition the period of access from the outside can be made shorter. A fast memory can thus be implemented.

FIG. 6B shows the case where the refresh period of the DRAM is reduced to half. In general, the refresh characteristic of the DRAM is aggravated when the temperature is high. When the temperature is high, for example, above 75° C., therefore, data can be retained by shortening the refresh period as illustrated. In the present embodiment, the temperature is detected by the temperature measuring circuit TMP, and the refresh period is altered by the refresh counter and the access control circuit (A_CONT).

In this example, the refresh period of 64 ms is shortened to a half, which is 32 ns. Each of the WORK and REF intervals is 4 ms. If it is now assumed in the same way that every access conducted during the REF interval is write access, then the maximum number of times thereof is 53,334 (=4 ms/75 ns). The time required for writing this into the DRAM is 3.74 ms (=53,334×70 ns), which is shorter than the T2 interval (3.856 ms). Even if refresh is conducted during the T1 interval, therefore, all of the write access conducted during the REF interval can be written back during the T2 interval.

In this way, the refresh of the DRAM can be hidden. Though a general purpose DRAM is used, it is possible according to the present embodiment to hide the refresh and handle the DRAM in the same way as the unsynchronous SRAM. Therefore, it is possible to implement a large capacity memory module that can be accessed by the unsynchronous SRAM interface. Furthermore, in the case where the DRAM is used also when the temperature is high, the large capacity memory module can be implemented by only shortening the refresh period as in the present embodiment. On the other hand, when the temperature is low, power required for data retention can be reduced by widening the refresh period. While the operation unit of the DRAM is set equal to two banks in the present embodiment, it may be altered according to the configuration of the memory module or memory chip. Furthermore, while the refresh period of 64 ms is divided into eight intervals and each interval is made the WORK interval or REF interval, the storage capacity of the FIFO retaining the data and address can be reduced by further dividing the refresh period into shorter intervals. On the contrary, if the refresh period is divided into longer intervals, then the number of times of switchover from the WORK interval to the REF interval and vice versa can be reduced, and consequently the control circuit for the switchover can be formed simply.

FIG. 7 is a flow chart showing access to the CHIP3 (DRAM). In STEP1, an address is inputted and operation is started. In STEP2, the kind of access is judged on the basis of a command. Ensuing operation differs depending upon the access kind. If the access is readout, then the processing proceeds to STEP3. In the STEP3, data is read out from a bank that is in a WORK interval and operation is finished. If the access is write, the processing proceeds to STEP4 and STEP5. In the STEP4, data is written into a bank that is in a WORK interval. On the other hand, in the STEP5, written data and its address are retained in the FIFO. Upon transition of a bank that is in a REF interval from a T1 interval to a T2 interval, the processing proceeds to STEP6 and data retained in the FIFO is written into the bank that is in the REF interval.

By thus reading/writing data from/into the DRAM, the influence of the refreshing can be avoided. By using a large capacity DRAM, therefore, a memory module having an unsynchronous SRAM interface can be formed.

Figure 8:
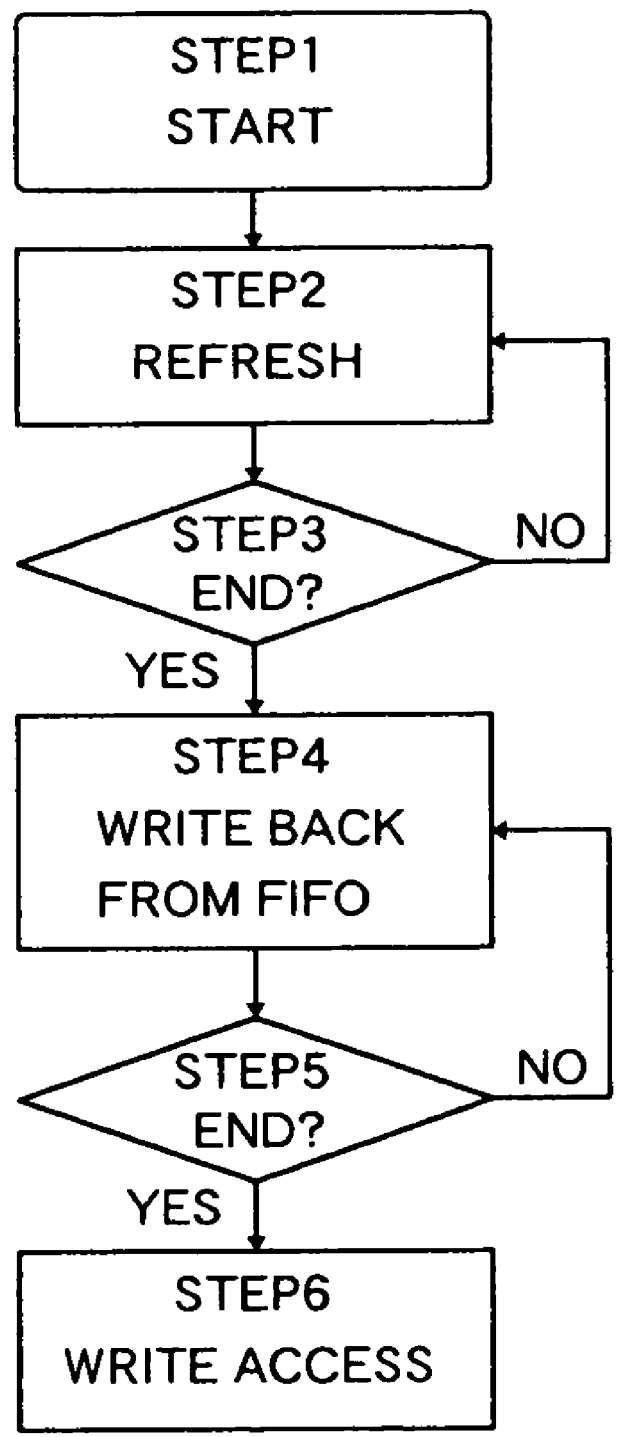
FIG. 8 is a flow chart showing a flow of operation in a DRAM bank conducted during a REF interval.

FIG. 8 is a flow chart showing operation of a bank that is in a REF interval of the CHIP3 (DRAM). STEP1 to STEP3 belong to a T1 interval, and STEP4 to STEP6 belong to a T2 interval. At the STEP1, the REF interval starts and refreshing is executed in the STEP2 in a concentrated manner. In the STEP3, the number of times of refreshing is administered. If refreshing of a determined area is finished, then the processing proceeds to the STEP4 and data stored in the FIFO is written into the bank. If it is judged at the STEP5 that writing data retained in the FIFO has been finished, then the processing proceeds to the STEP6 and it is also possible to accept write access. Alternatively, it is also possible to wait for data inputting while remaining in the state of the STEP4 and then execute write access.

If a bank that is in a REF interval is made to operate as heretofore described, then the refresh operation and write access execution can be reconciled within a REF interval. As a result, the influence of the refreshing can be avoided. By using a large capacity DRAM, therefore, a memory module having an unsynchronous SRAM interface can be formed.

Figure 9A:
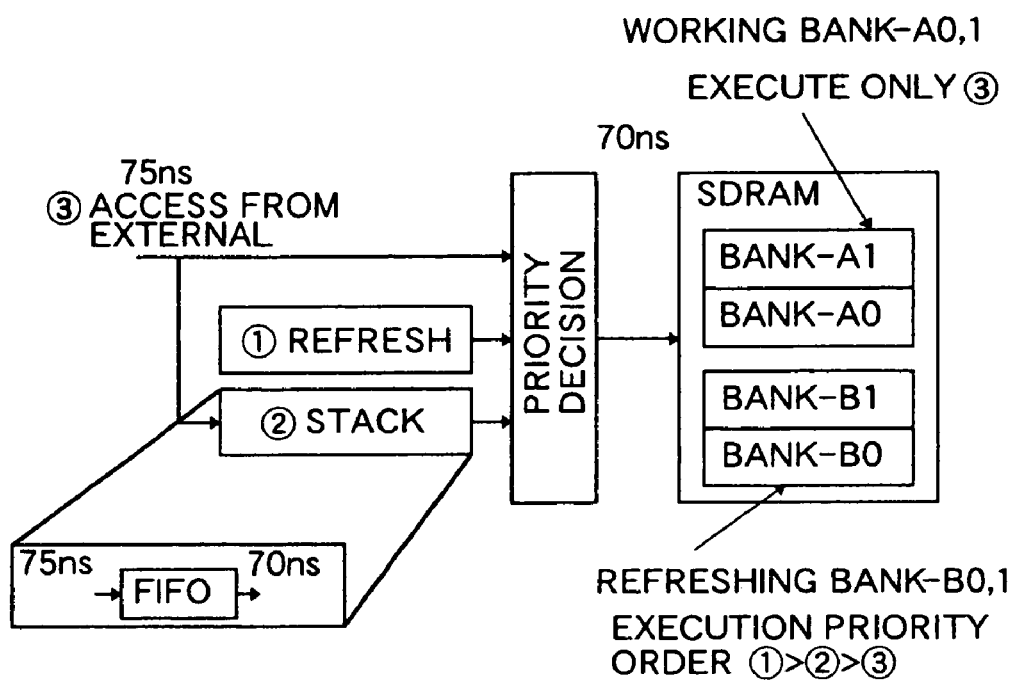
FIGS. 9A and 9B are diagrams showing how an access to a DRAM and its refresh are conducted simultaneously.
Figure 9B:
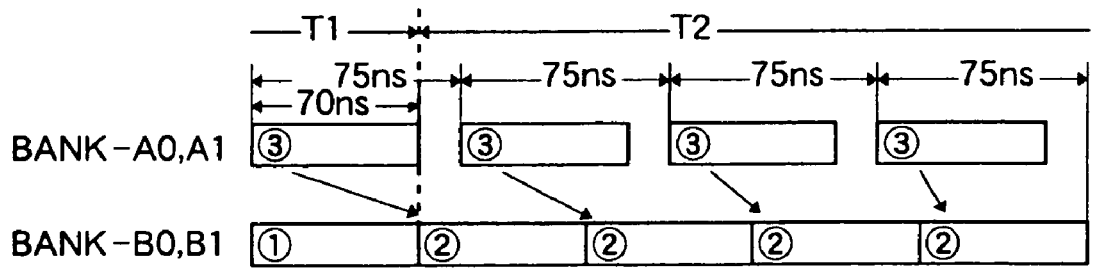

FIGS. 9A and 9B show how access to the DRAM is provided with a priority order. Operation of the DRAM according to the present invention can be described with the idea that access to a bank that is in a REF interval is provided with an execution priority order.

FIG. 9A schematically shows the priority order. In the BANK-A0 and BANK-A1 in a WORK interval, only external access is conducted as illustrated. The external access is conducted preferentially for the BANK-A0 and BANK-A1 in a REF interval. On the other hand, in the BANK-B0 and BANK-B1 in a REF interval, refresh, writing data retained in the FIFO, and external write access are conducted. Execution of them is provided with a priority order by the access controller (A_CONT). They are executed with priority orders of, and.

FIG. 9B shows how these accesses are executed in accordance with the priority orders. In FIG. 9B, BANK-A0 and BANK-A1 are in a WORK interval, and BANK-B0 and BANK-B1 are in a REF interval. In the BANK-A0 and BANK-A1, only the external access is executed. On the other hand, the BANK-B0 and BANK-B1 are just on the point of shifting from a T1 interval to a T2 interval. Refresh that has been executed in the T1 interval is finished, and a shift is conducted to a T2 interval where writing data retained in the FIFO is executed. Furthermore, external access is conducted in 75 ns, whereas internal operation is executed in 70 ns. Therefore, processing of data retained in the FIFO proceeds faster than the external access.

If the banks in the WORK interval and in the REF interval are made to operate as heretofore described, then external access can be executed on the banks that are in the WORK interval while executing the refresh operation on the banks that are in the REF interval and writing data retained in the FIFO into the banks that are in the REF interval. Owing to this operation method, the influence of the refreshing can be avoided. By using a large capacity DRAM, therefore, a memory module having an unsynchronous SRAM interface can be formed.

Figure 10:
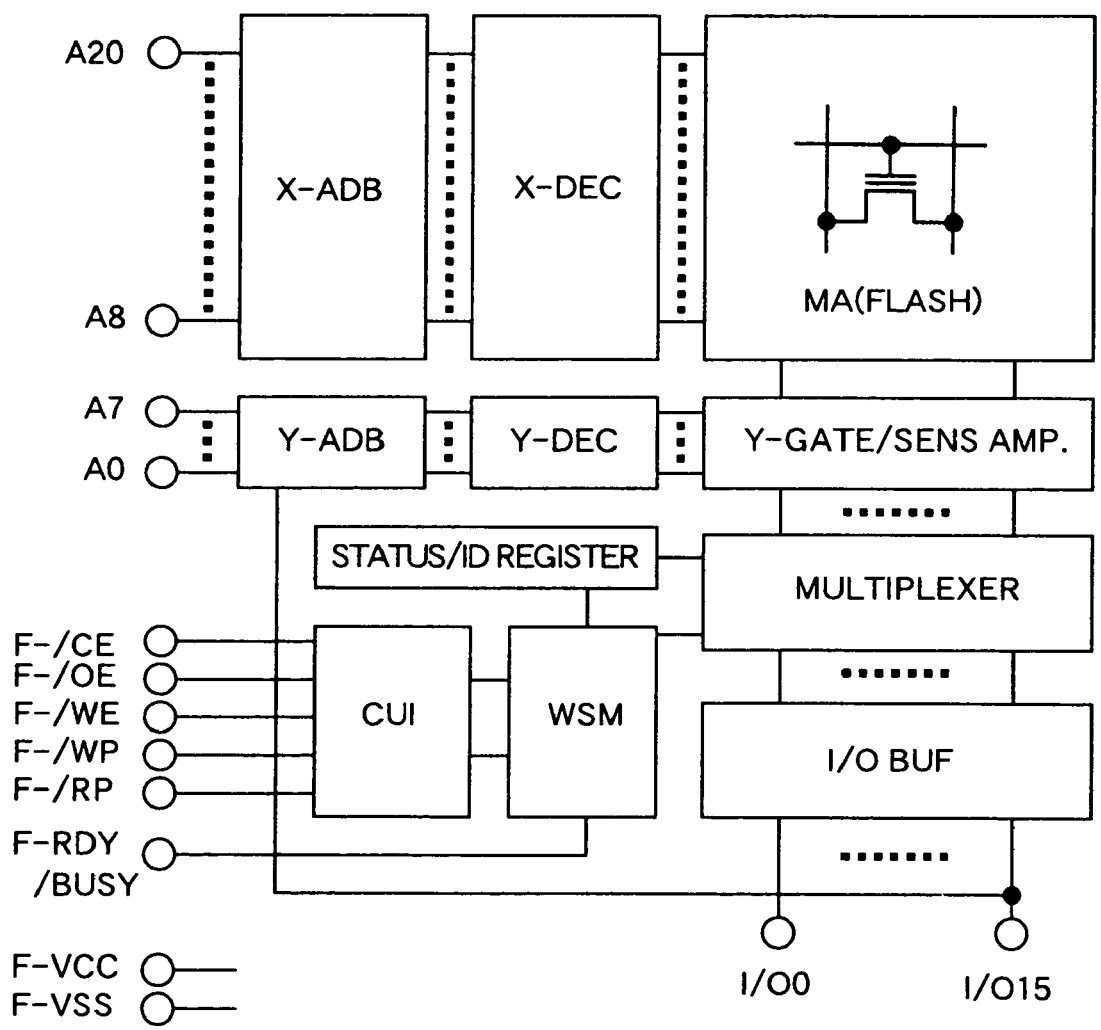
FIG. 10 is a block diagram showing a configuration example of a flash memory.

FIG. 10 shows a configuration example of the CHIP1 (FLASH) in the present embodiment. The configuration includes an X address buffer X-ADB, an X decoder X-DEC, a memory array MA, a Y address buffer Y-ADB, a Y decoder Y-DEC, a Y gate (column switch) & sense amplifier circuit Y-GATE/SENS AMP., a status/ID retention register STATUS/ID REGISTER, a multiplexer MULTIPLEXER, a data input-output buffer I/O BUF, a write state machine WSM which is a control circuit of writing and erasing, and a command user interface CUI for decoding and executing a command. Operation of the CHIP1 is similar to that of a FLASH memory typically used heretofore. A memory module of the present embodiment can be formed by using this CHIP1 (FLASH).

Figure 11:
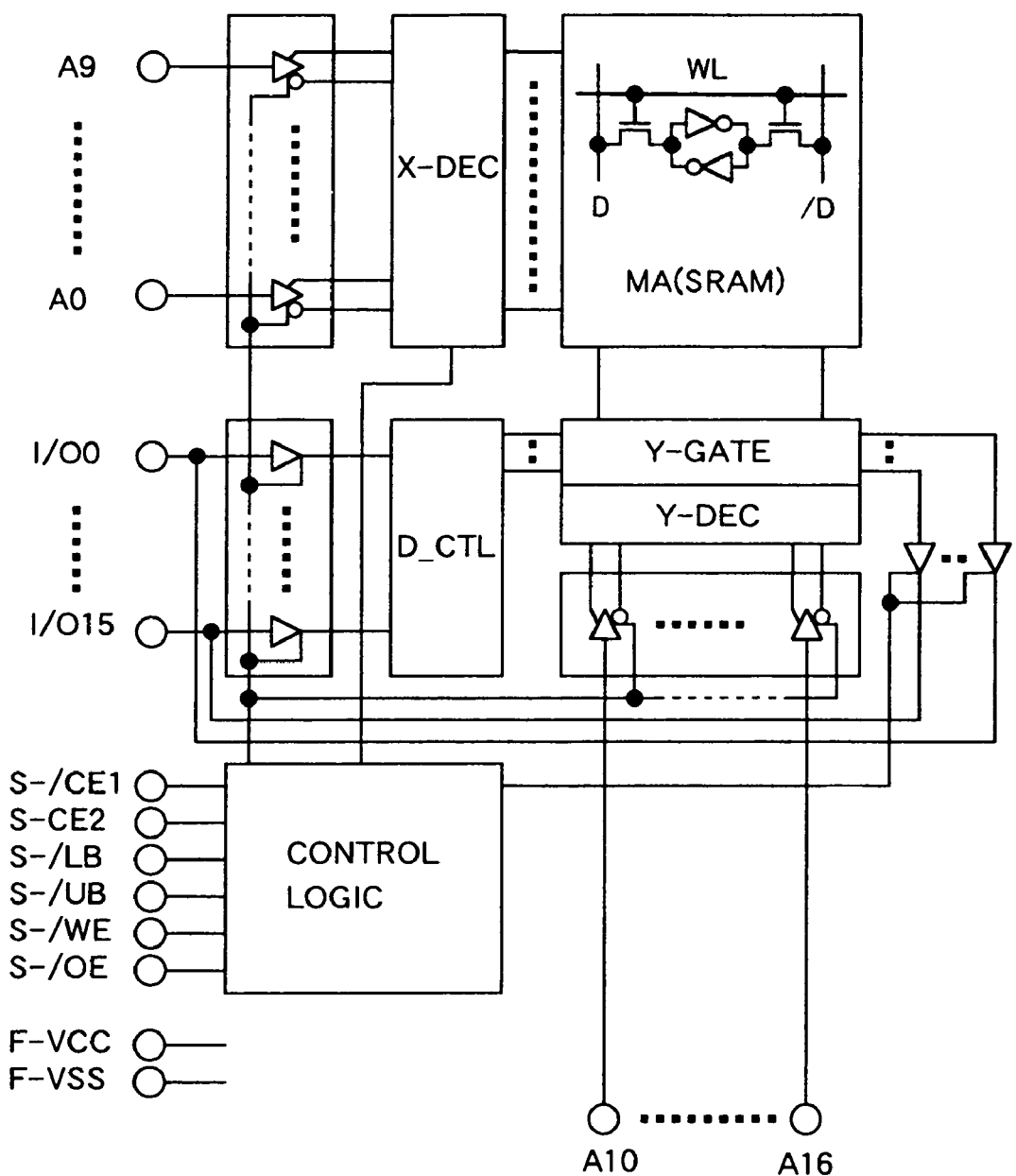
FIG. 11 is a block diagram showing a configuration example of an SRAM.

FIG. 11 shows a configuration example of the SRAM in the present embodiment. The configuration includes an X decoder X-DEC, a memory array MA, a Y gate Y-GATE, a Y decoder Y-DEC, an input data control circuit D_CTL, a control circuit CONTROL LOGIC, and input-output buffers of respective signal lines. This SRAM is a typical so-called unsynchronous SRAM. By using this SRAM, a memory module of the present embodiment can be formed.

Figure 12:
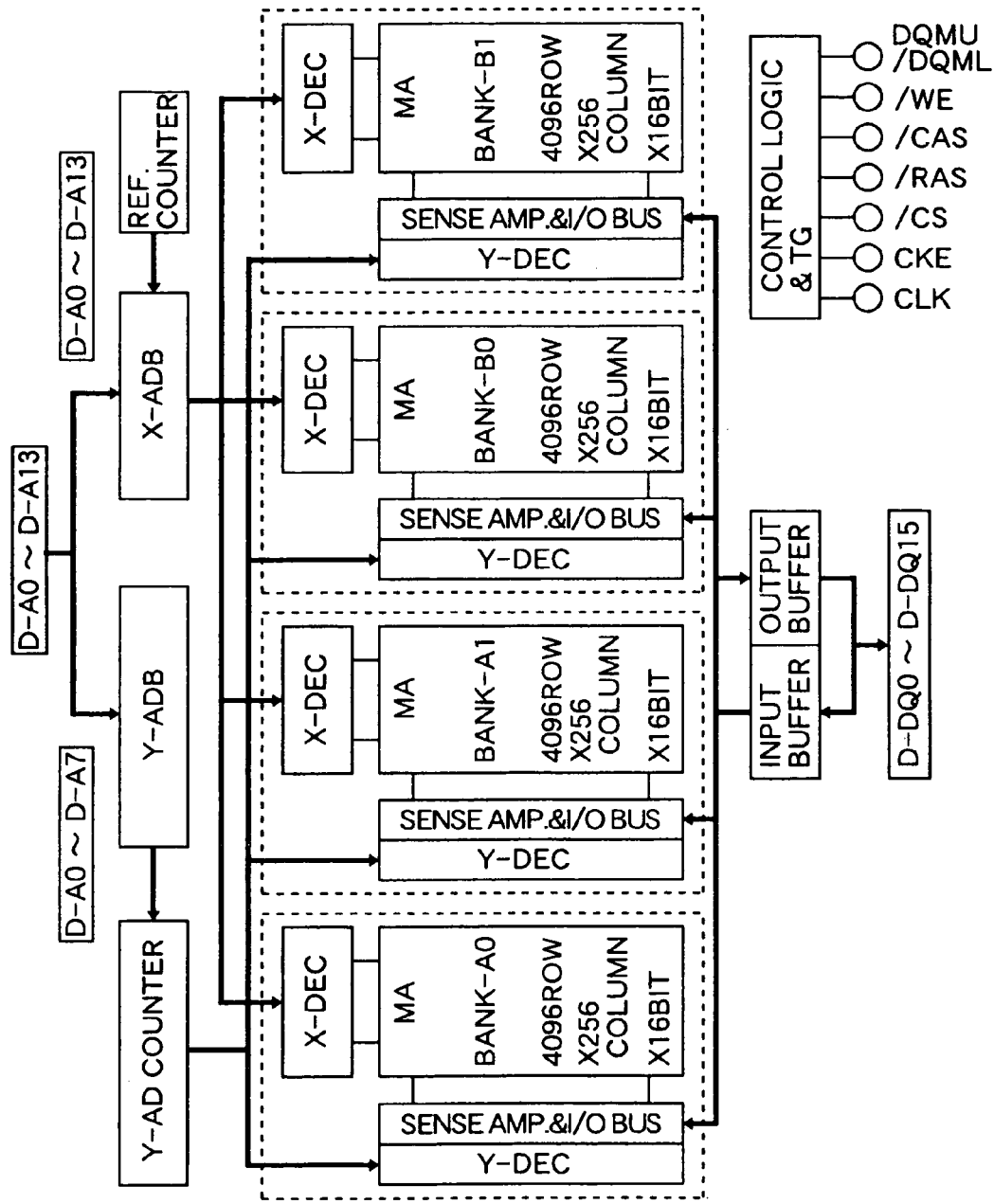
FIG. 12 is a block diagram showing a configuration example of a DRAM.

FIG. 12 shows a configuration example of the DRAM in the present embodiment. The configuration includes an X address buffer X-ADB, a refresh counter REF. COUNTER, an X decoder X-DEC, a memory array MA, a Y address buffer Y-ADB, a Y address counter Y-AD COUNTER, a Y decoder Y-DEC, a memory array MA, a sense amplifier circuit & Y gate (column switch) SENSE AMP. & I/O BUS, an input data buffer circuit INPUT BUFFER, an output data buffer circuit OUTPUT BUFFER, and a control circuit & timing generation circuit CONTROL LOGIC & TG. The DRAM is a conventionally used general-purpose SDRAM. Although not especially restricted, to be concrete, the DRAM includes four independently operable memory banks, and address input terminals and data input and output terminals for them are shared and utilized in time division by respective banks. By using this DRAM, the memory module of the present embodiment can be formed.

Figure 13:
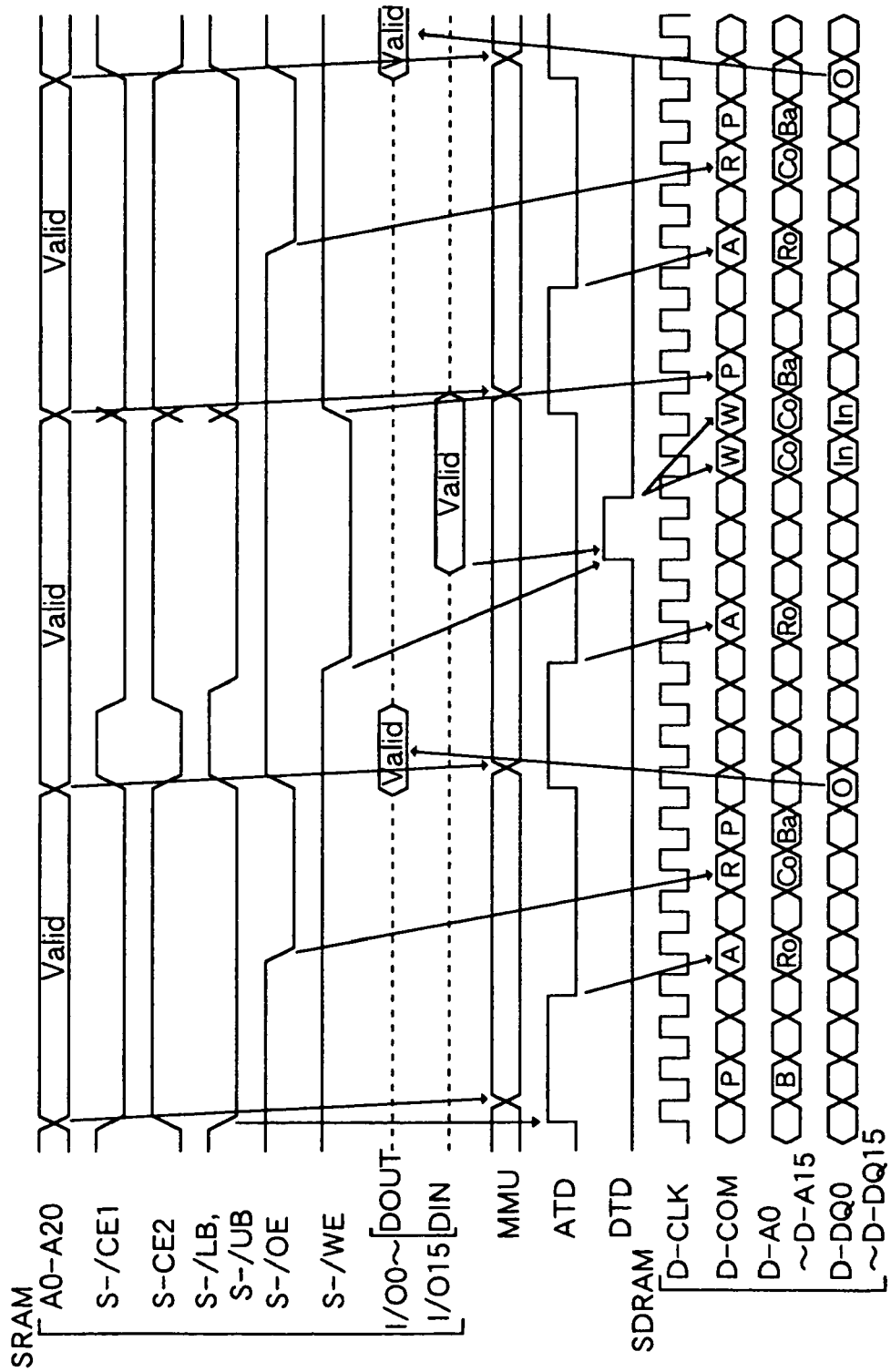
FIG. 13 is a diagram showing an example of a time chart of a memory module according to an embodiment of the present invention.

FIG. 13 shows an example of an operation waveform of a memory module according to an embodiment of the present invention. A0 to A20, S-/CE1, S-CE2, S-/LB, S-/UB, S-/OE and S-/WE are signals inputted to the memory module, and they are interface signals of the so-called unsynchronous SRAM. Data input and output signals I/O0 to I/O15 are divided into data inputs and data outputs, and represented as DIN and DOUT, respectively. MMU, ATD and DTD represent output signals of the MMU circuit, ATD circuit, and DTD circuit, respectively. D-CLK denotes a clock supplied to the DRAM. D-COM is a general term of command signals supplied to the DRAM. D-A0 to D-A15 denote address lines of the DRAM, and D-DQ0 to D-DQ15 denote I/O lines of the DRAM.

First, read access conducted first will now be described. If the address A0 to A20 is inputted, the MMU circuit outputs a converted address. The ATD circuit senses changes of the address A0 to A20 and commands (S-/CE1, S-CE2, S-/LB, S-/UB, S-/OE and S-/WE). If the address and command are established, the ATD circuit outputs a pulse. In response to this pulse, a bank active command A is issued to the DRAM, and the DRAM is brought into a bank active state. Subsequently, the control circuit issues a read command R in response to a falling edge of the S-/OE signal. Data read out from the DRAM is outputted to D-DQ0 to D-DQ15, and outputted to I/O0 to I/O15 through the R/W BUFFER.

In the next cycle, an execution example of write access is shown. In the case of write access as well, a bank active command A is issued in response to a falling edge of the ATD signal in the same way as the read access. Thereafter, the DTD circuit senses changes of the I/O0 to I/O15 and commands (S-/CE1, S-CE2, S-/LB, S-/UB, S-/OE and S-/WE), and outputs a pulse. In response to this pulse, a write command is executed. Since data to be written is established in response to a rising edge of S-/WE which indicates the end of write access, the write command is issued consecutively until a rising edge of S-/WE. This is conducted in order to cope with the case where data to be written has changed after the start of the last cycle. In the operation example shown in FIG. 13, two write commands are issued consecutively. Thereafter, the write operation is finished in response to a rising edge of the S-/WE signal. A pre-charge command is thus issued.

According to the embodiment heretofore described, it becomes possible to implement a large capacity memory module using an expensive general-purpose DRAM, while following the SRAM interface system. In the control circuit (CTL_LOGIC) according to the present invention, a DRAM is used. Since refreshing required for the DRAM is executed by the control circuit (CTL_LOGIC), however, the DRAM can be used in the same way as the SRAM without taking refresh into consideration. In addition, the refresh of the DRAM can be hidden from the outside of the DRAM by duplicating the data retention in the DRAM and adjusting the refresh timing. When accessing the present memory module, therefore, there is no need to adjust timing while taking the refresh into consideration. Accordingly, the present memory module can be used in the same way as the conventional memory module using only the SRAM. Without changing the conventional system, therefore, a large capacity memory module can be used.

Embodiment 2

Figure 14:
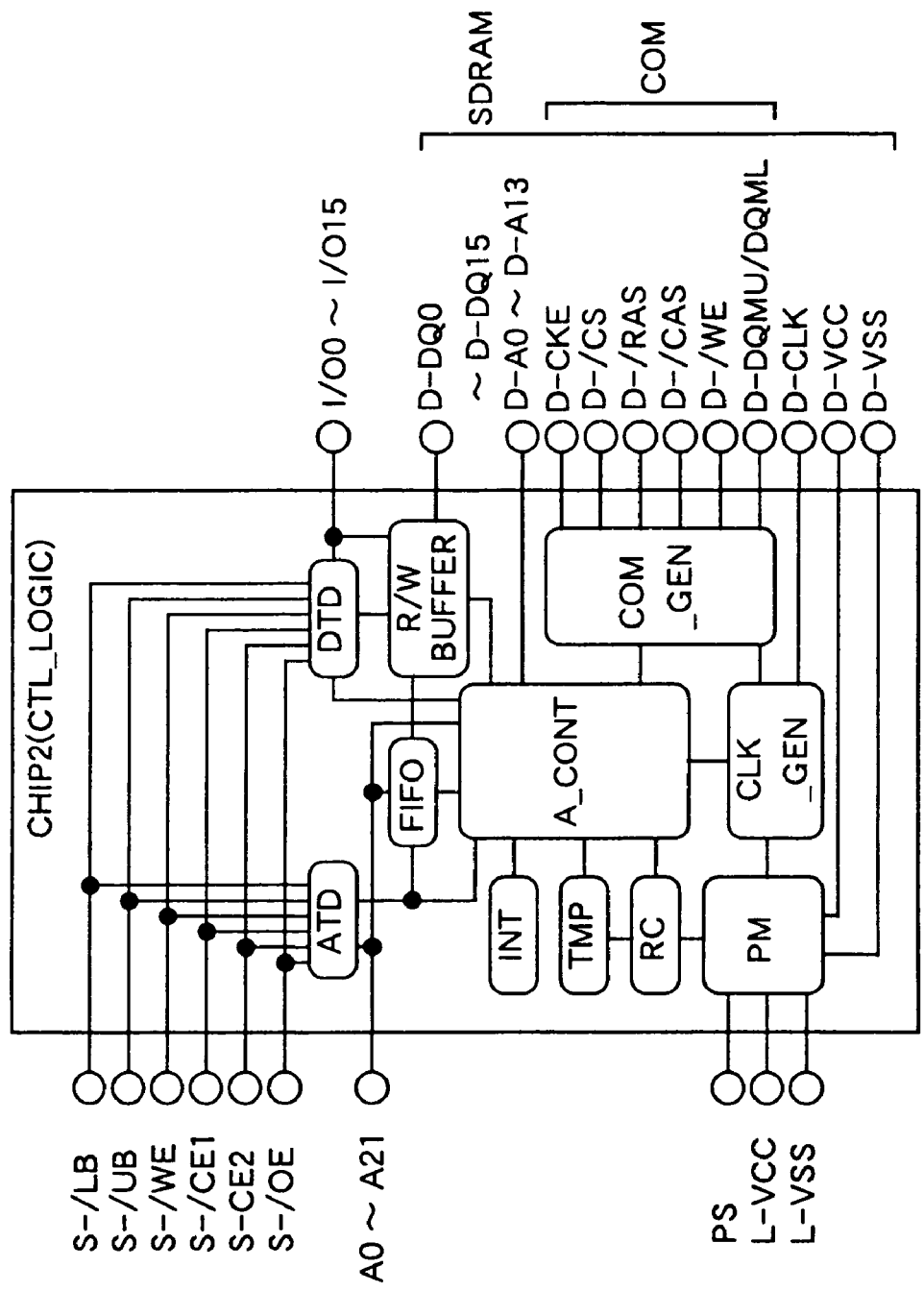
FIG. 14 is a block diagram showing a configuration example of CHIP2 illustrated in FIG. 1.

FIG. 14 shows a different embodiment of the CHIP2 included in a memory module according to an embodiment of the present invention.

The CHIP2 (CTL_LOGIC) in the present embodiment is formed of a control circuit (CTL_LOGIC). The CHIP2 (CTL_LOGIC) includes ATD, DTD, FIFO, R/W BUFFER, A_CONT, INT, TMP, RC, PM, CLK_GEN and COM_GEN. The CHIP2 in the present embodiment differs from the CHIP2 shown in FIG. 2 in that the SRAM, the access switch AS, and the MMU are not incorporated. Therefore, every access is executed to the DRAM. Hereafter, its operation will be described.

An address transition detector circuit (ATD) detects changes in the address signal and the command signals, and outputs a pulse. A data transition detector circuit (DTD) detects changes in the data signal and the command signals, and outputs a pulse. A R/W BUFFER retains data temporarily for DRAM reading and writing. A FIFO is a first-in first-out buffer circuit, which temporarily retains data written into the DRAM and its address. An initial circuit INT initializes the DRAM when power supply to the DRAM is started. A temperature measuring module (TMP) detects the temperature, and outputs a signal depending on the detected temperature to the RC and A_CONT. The RC is a refresh counter, which generates an address of refreshing according to the refresh period of the DRAM. Furthermore, the refresh counter RC alters the refresh period according to the temperature in response to an output signal of the temperature measuring module (TMP). A power module (PM) conducts power supply to the control circuit (CTL_LOGIC) of the CHIP2 and the DRAM and control of the power supply. A clock generator (CLK_GEN) generates a clock and supplies it to the DRAM and the control circuit (CTL_LOGIC). A command generator (COM_GEN) generates a command required to access the DRAM. An access controller (A_CONT) conducts control of the whole operation of the CHIP2 (CTL_LOGIC) and generates an address for accessing the DRAM.

The CHIP2 (CTL_LOGIC) is interfaced by using the unsynchronous SRAM system. When a signal is sent from the outside by using the unsynchronous SRAM system, the CHIP2 converts the signal and accesses the DRAM. Data inputting and outputting and refresh operation are controlled by the CHIP2.

Operation of respective blocks of the control circuit conducted when executing read access to the DRAM will hereafter be described. First, the address inputted from the outside and the command sensed by the ATD are sent to the A_CONT. The A_CONT judges the execution of the access to the DRAM on the basis of the sent address and command, and orders the COM_GEN to issue a command to the DRAM. Furthermore, the A_CONT converts the received address to an address for the DRAM, and outputs the address for the DRAM to the DRAM. In synchronism with the clock generated by the CLK_GEN, the COM_GEN issues a command to the DRAM. Upon receiving the command and the address, the DRAM outputs data. The outputted data is transferred to the I/O0 to I/O15 via the R/W BUFFER. The read access is thus finished.

When executing write access to the DRAM, the address inputted from the outside, the command sensed by the ATD, the command and data sensed by the DTD are sent to the A_CONT. The A_CONT judges execution of access to the DRAM on the basis of the sent address and command, and orders the COM_GEN to issue a command to the DRAM. Furthermore, the A_CONT converts the received address to an address for the DRAM, and outputs the address for the DRAM to the DRAM. In synchronism with the clock generated by the CLK_GEN, the COM_GEN issues a command to the DRAM. Data to be written is inputted from the I/O0 to I/O15 and temporarily retained in the R/W BUFFER, then sent to the DRAM and written into the DRAM. In addition, the data thus written and the address are retained in the FIFO as well, and written into a different bank of the DRAM as well later. Operation other than the access to the memory is the same as that described with reference to the embodiment 1.

According to the embodiment heretofore described, the CHIP2 can be formed in a smaller area without incorporating the SRAM, access switch AS, and MMU. Therefore, a large capacity memory module can be implemented at a low price. In addition, since the DRAM can be accessed without intervention of the operation of the access switch AS and the MMU, a faster large capacity memory module can be implemented. By the way, other effects of the present embodiment are the same as those already described with reference to the embodiment 1.

Embodiment 3

Figure 15:
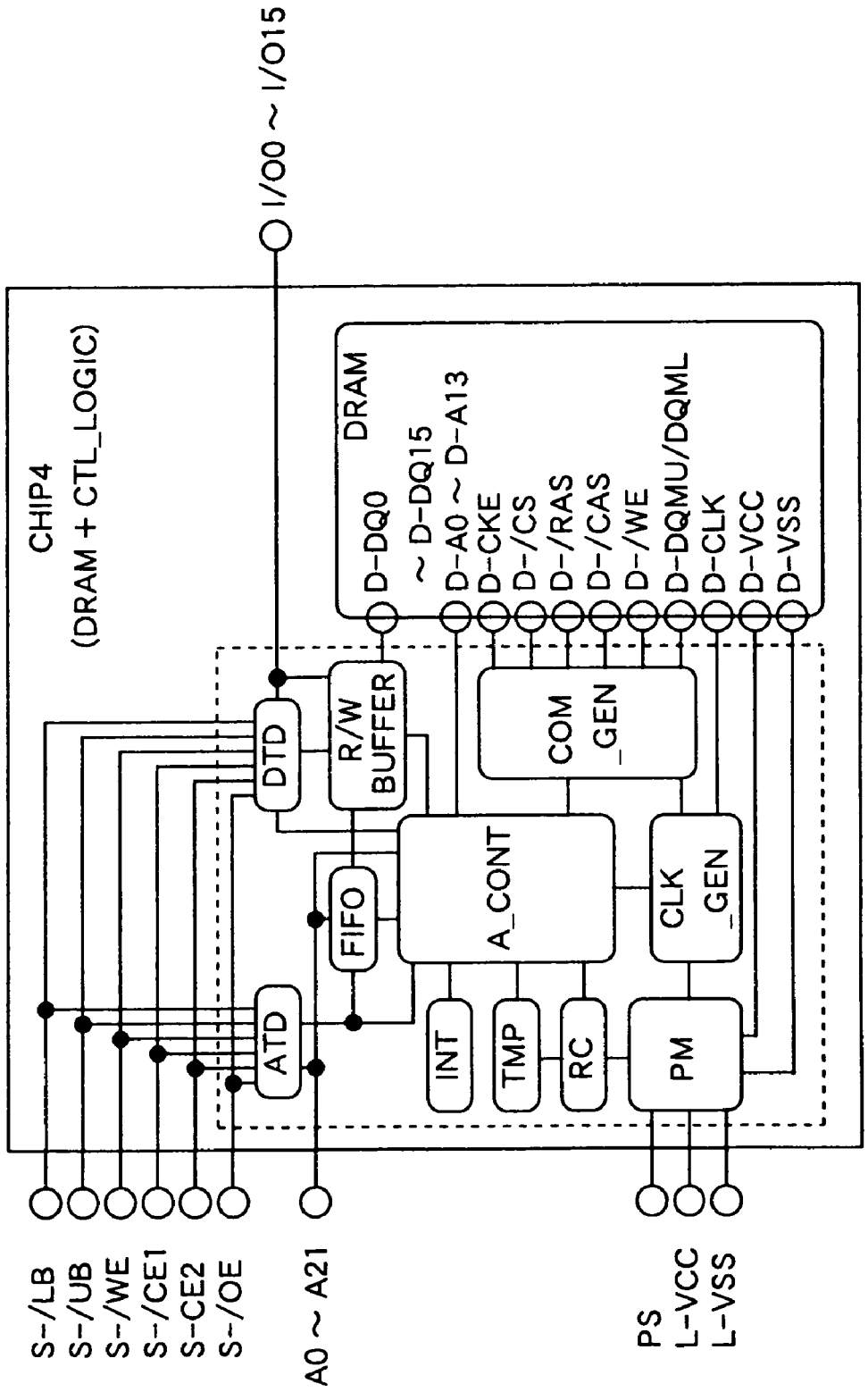
FIG. 15 is a diagram showing an embodiment of a large capacity memory of an unsynchronous SRAM interface system utilizing a DRAM according to an embodiment of the present invention.

FIG. 15 shows a third embodiment of the CHIP2 and CHIP 3 included in a memory module according to an embodiment of the present invention. A CHIP4 (DRAM+CTL_LOGIC) in the present embodiment is formed of a control circuit (CTL_LOGIC) and a DRAM. ATD, DTD, FIFO, R/W BUFFER, A_CONT, INT, TMP, RC, PM, CLK_GEN and COM_GEN included in the control circuit and the DRAM are integrated into a single chip. It is equivalent to a configuration obtained by additionally mounting the DRAM on the CHIP2 shown in FIG. 14. Hereafter, its operation will be described.

An address transition detector circuit (ATD) detects changes in the address signal and the command signals, and outputs a pulse. A data transition detector circuit (DTD) detects changes in the data signal and the command signals, and outputs a pulse. A R/W BUFFER retains data temporarily for DRAM reading and writing. A FIFO is a first-in first-out buffer circuit, which temporarily retains data to be written into the DRAM and its address. An initial circuit INT initializes the DRAM when power supply to the DRAM is started. A temperature measuring module (TMP) detects the temperature, and outputs a signal depending on the detected temperature to a refresh counter RC and an access controller A_CONT. The refresh counter RC generates an address of refreshing according to the refresh period of the DRAM. Furthermore, the refresh counter RC alters the refresh period according to the temperature in response to an output signal of the temperature measuring module (TMP). A power module (PM) conducts power supply to the control circuit (CTL_LOGIC) of the CHIP2 and the DRAM and control of the power supply. A clock generator (CLK_GEN) generates a clock and supplies it to the DRAM and the control circuit (CTL_LOGIC). A command generator (COM_GEN) generates a command required to access the DRAM. An access controller (A_CONT) conducts control of the whole operation of the CHIP4 (DRAM+CTL_LOGIC) and generates an address for accessing the DRAM. For executing memory access to the CHIP4 (DRAM+CTL_LOGIC), interfacing is conducted by using the so-called unsynchronous SRAM system. When a signal is sent from the outside by using the unsynchronous SRAM system, the control circuit converts the signal and accesses the DRAM.

Operation of respective blocks of the control circuit conducted when executing read access to the DRAM will hereafter be described. First, the address inputted from the outside is sent to the A_CONT. An address change and a command signal are sensed by the ATD. The ATD outputs a pulse to the A_CONT. The A_CONT judges the execution of the access to the DRAM on the basis of the sent address and command, and orders the COM_GEN to issue a command to the DRAM. Furthermore, the A_CONT converts the received address to an address for the DRAM, and outputs the address for the DRAM to the DRAM. In synchronism with the clock generated by the CLK_GEN, the COM_GEN issues a command to the DRAM. Upon receiving the command and the address, the DRAM outputs data. The outputted data is transferred to the I/O0 to I/O15 via the R/W BUFFER. The read access is thus finished. The case where write access to the DRAM is executed will now be described. The address inputted from the outside, the command sensed by the ATD, the command and data sensed by the DTD are sent to the A_CONT. The A_CONT judges execution of access to the DRAM on the basis of the sent address and command, and orders the COM_GEN to issue a command to the DRAM. Furthermore, the A_CONT converts the received address to an address for the DRAM, and outputs the address for the DRAM to the DRAM. In synchronism with the clock generated by the CLK_GEN, the COM_GEN issues a command to the DRAM. Data to be written is inputted from the I/O0 to I/O15 and temporarily retained in the R/W BUFFER, then sent to the DRAM and written into the DRAM. In addition, the data thus written and the address are retained in the FIFO as well, and written into a different bank of the DRAM as well later.

Power supplied to the DRAM is controlled by the power module (PM). In some cases, it is desirable to reduce the consumption current of the device having the memory module mounted thereon according to the operation state. In such a case, the power module can stop the refresh conducted by the refresh counter according to the command signal PS, and thereby reduce power required to refresh the DRAM.

In the case where it is desirable to further reduce the consumption power, power supplied to the DRAM can be disconnected within the CHIP4. In this case, the power module stops power to the D-VCC supplied to the DRAM according to the command signal PS outputted by the device.

In the case where it is desirable to further reduce the power consumption, the power module can stop supply of power to a portion of the CHIP4 (DRAM+CTL_LOGIC) concerning the memory access to the DRAM, according to the command signal PS. In this state, it is possible to connect power supply to, for example, only the ATD of the CHIP4 (DRAM+CTL_LOGIC), and bring about a stand-by state. By the way, operation other than this is the same as that described with reference to the embodiment 1.

According to the embodiment heretofore described, a large capacity memory module using a DRAM while following the SRAM interface system can be implemented. The present invention brings about the following effects besides the effects already described with reference to the embodiment 1.

According to the present embodiment, it is possible to reduce the number of parts of the memory module, simplify the assembling process of the module, and reduce the cost. In addition, the present embodiment can be used not only as a memory module, but also as a large capacity SRAM by itself. By using an inexpensive DRAM while following the SRAM interface system, a large capacity SRAM-compatible chip can be implemented within a small area.

Embodiment 4

Figure 16A:
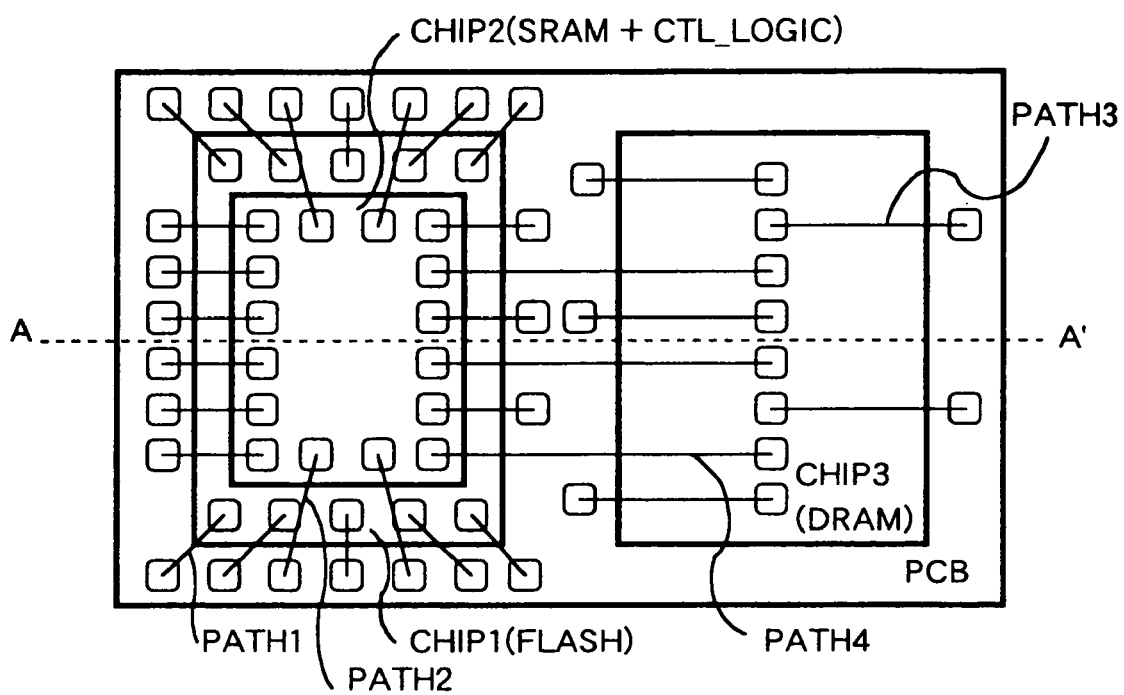
FIGS. 16A and 16B are diagrams showing an example of a mounting form of a memory module according to an embodiment of the present invention.
Figure 16B:
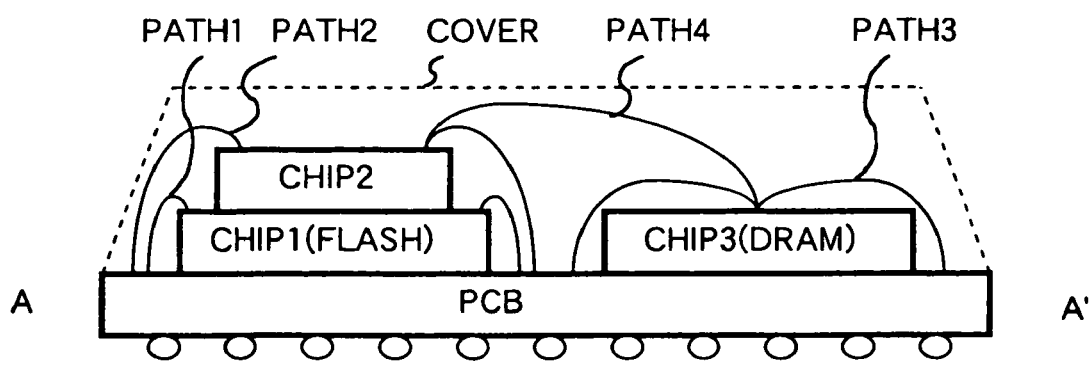

FIGS. 16A and 16B show a memory module according to an embodiment of the present invention. FIG. 16A shows a top view, and FIG. 16B shows a sectional view. In the present memory module, CHIP1 (FLASH) and CHIP3 (DRAM) are mounted on a board (such as a printed circuit board PCB made of a glass epoxy substrate) that is mounted on a device by using a ball grid array (BGA). Although not especially restricted, the so-called bear chip of a general-purpose DRAM is used as the CHIP3. In the bear chip, signal pads and power supply pads are arranged in a line on the center of the chip. Further on the top surface of the CHIP1 (FLASH), CHIP2 (SRAM+CTL_LOGIC) is mounted. The CHIP1 and bonding pads on the board are connected by bonding wires (PATH1). The CHIP2 and bonding pads on the board are connected by bonding wires (PATH2). The CHIP3 is connected to bonding pads on the board by bonding wires (PATH3). In addition, the CHIP3 is connected to the CHIP2 by bonding wires (PATH4). The top surface of the board having chips mounted thereon is molded by resin serving as a seal in order to protect respective chips and connection wires. By the way, a cover (COVER) made of metal, ceramic, or resin may be used over it.

In the present embodiment of the present invention, the CHIP2 can be mounted on the CHIP1 and consequently a memory module having a small mounting area can be formed. Furthermore, since chips can be arranged in close vicinity to each other, chip-to-chip wiring length can be shortened. By conducting chip-to-chip wiring and chip-to-board wiring uniformly with the bonding wire system, a memory module can be fabricated with a smaller number of processes. In addition, since chip-to-chip wiring is directly implemented by bonding wires, the number of bonding pads on the board and the number of bonding wires can be reduced and the memory module can be fabricated with a smaller number of processes. Since bear chips of a general-purpose DRAM fabricated in mass production can be used, the memory modules can be stably supplied at a low price. In the case where a resin cover is used, a stronger memory module can be formed. In the case where a ceramic or metal cover is used, a memory module which is excellent in heat radiation and shield effect besides strength can be formed.

Figure 17A:
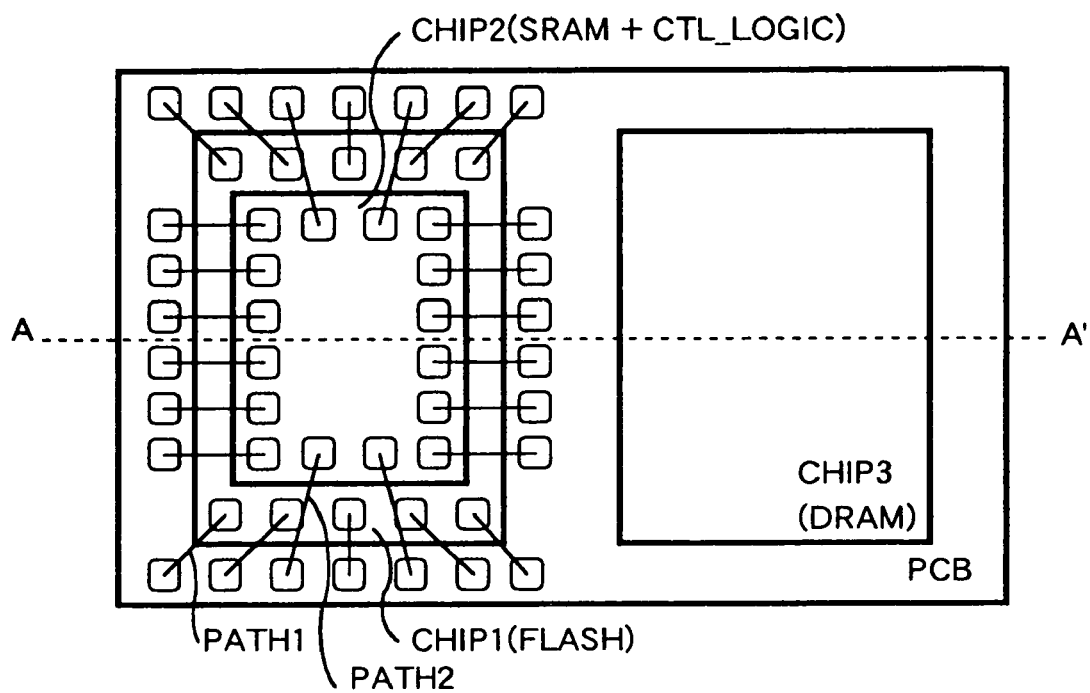
FIGS. 17A and 17B are diagrams showing an example of a mounting form of a memory module according to an embodiment of the present invention.
Figure 17B:
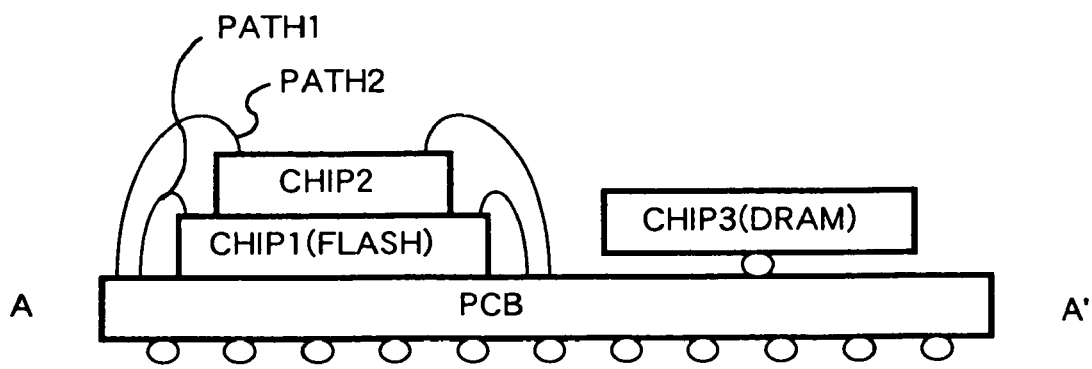

FIGS. 17A and 17B show a variation example of FIGS. 16A and 16B of the memory module according to an embodiment of the present invention. FIG. 17A shows a top view, and FIG. 17B shows a sectional view. In this example, for mounting a CHIP3 (DRAM) on a board and wiring, the ball grid array (BGA) is used. A method of turning the circuit forming face of the semiconductor chip down and conducting connection via metal bumps represented by solder bumps is called face down bonding as well. Owing to this mounting method, bonding between the CHIP3 and the board and bonding between the CHIP3 and the CHIP2 become unnecessary, and the number of bonding wires can be reduced. Therefore, the number of assembling processes can be reduced, and a memory module of higher reliability can be implemented.

Figure 18A:
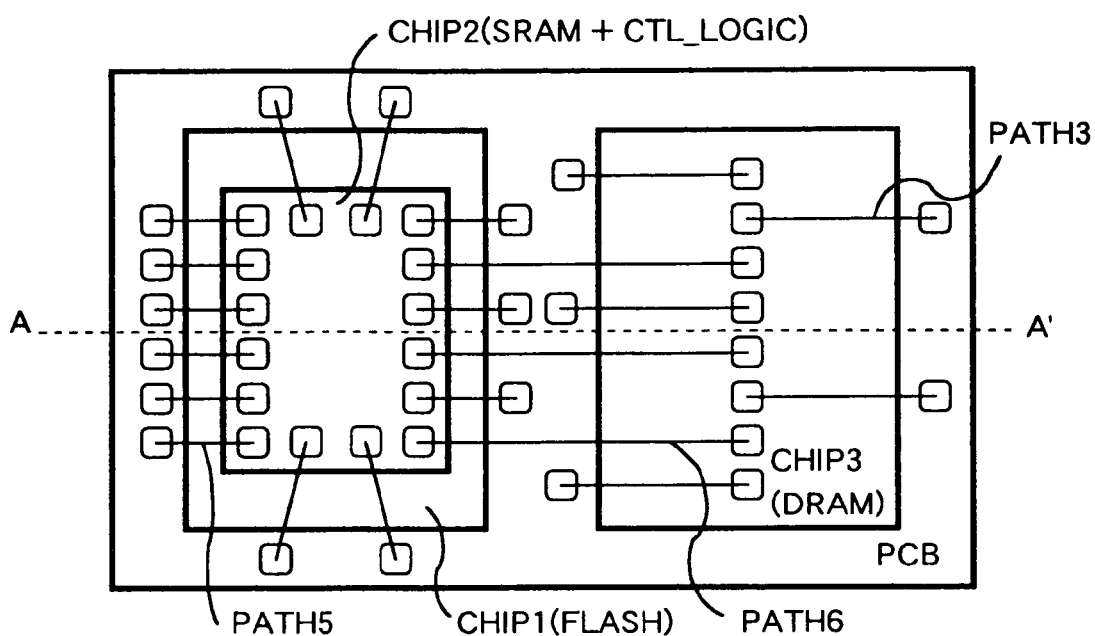
FIGS. 18A and 18B are diagrams showing an example of a mounting form of a memory module according to an embodiment of the present invention.
Figure 18B:
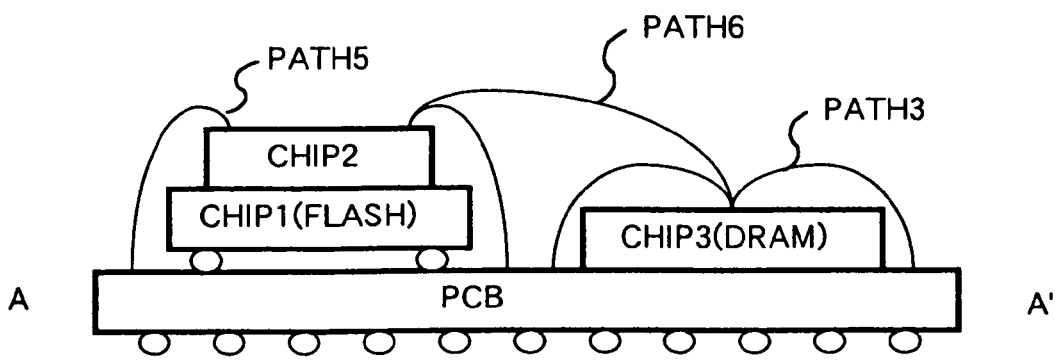

FIGS. 18A and 18B show a variation example of FIGS. 16A and 16B of the memory module according to an embodiment of the present invention. FIG. 18A shows a top view, and FIG. 18B shows a sectional view. In this example, for mounting a CHIP1 (FLASH) on a board and wiring, the ball grid array (BGA) is used. In addition, PATH5 is used for wiring between a CHIP2 mounted on the CHIP1 and the board, and PATH6 is used for wiring between the CHIP2 and a CHIP3. Owing to this mounting method, bonding between the CHIP1 and the board becomes unnecessary, and the number of wiring conductors can be reduced. Therefore, the number of assembling processes can be reduced, and in addition a memory module of higher reliability can be implemented. Furthermore, since there is no wiring between the CHIP1 and the board, the PATH5 between the CHIP2 and the board having a large height difference can be provided easily with a low wiring density. The PATH6 also has a lowered wiring density in the same way. In addition, since wiring is conducted onto the top surface of the CHIP3, the height difference is reduced and bonding is facilitated.

Figure 19A:
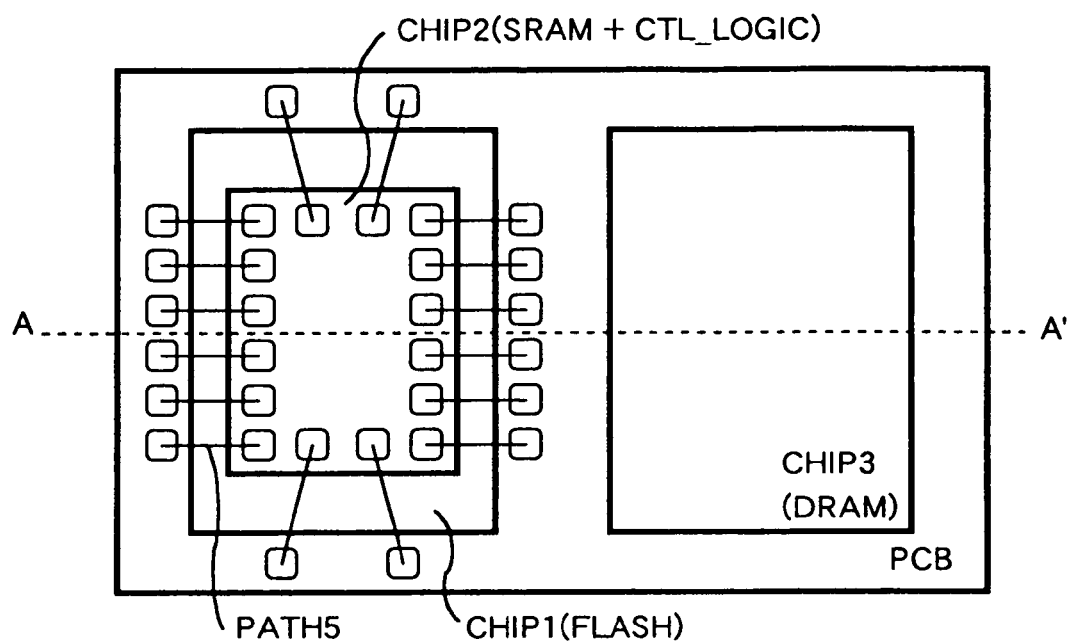
FIGS. 19A and 19B are diagrams showing an example of a mounting form of a memory module according to an embodiment of the present invention.
Figure 19B:
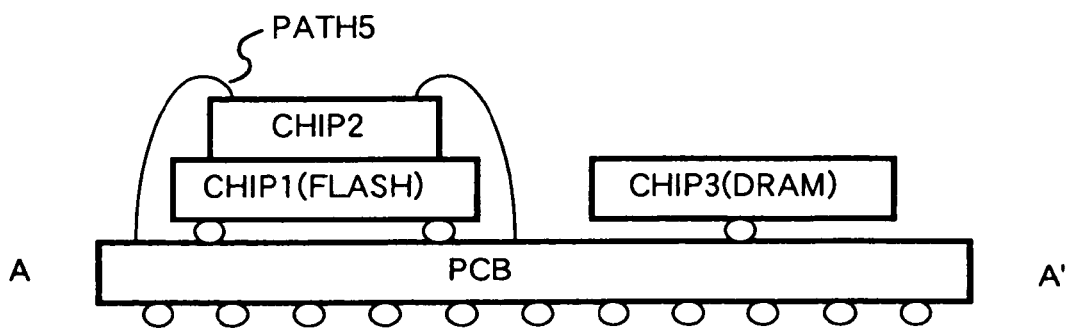

FIGS. 19A and 19B show a variation example of FIGS. 16A and 16B of the memory module according to an embodiment of the present invention. FIG. 19A shows a top view, and FIG. 19B shows a sectional view. In this example, for mounting a CHIP1 and a CHIP3 on a board, the ball grid array (BGA) is used. Since bonding wiring is required only between a CHIP2 and the board, the number of wires is reduced, and a memory module having a high reliability can be implemented. Furthermore, since there is no wiring between the CHIP1 and the board, the PATH5 between the CHIP2 and the board can be lowered in wiring density and the boding process can be facilitated.

Figure 20A:
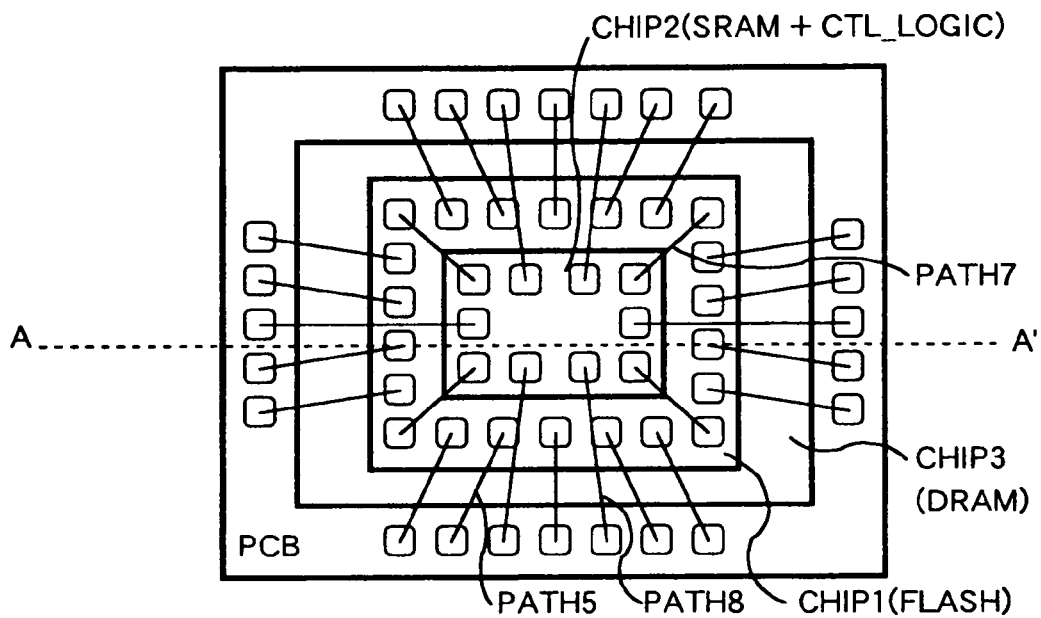
FIGS. 20A and 20B are diagrams showing an example of a mounting form of a memory module according to an embodiment of the present invention.
Figure 20B:
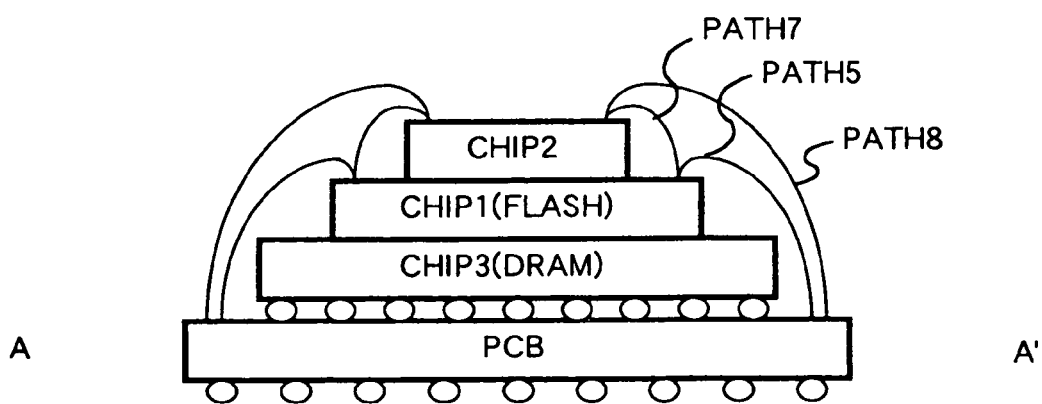

FIGS. 20A and 20B show a variation example of FIGS. 16A and 16B of the memory module according to an embodiment of the present invention. FIG. 20A shows a top view, and FIG. 20B shows a sectional view. In this example, a CHIP1 is mounted on a CHIP3 mounted on a board by using the ball grid array, and a CHIP2 is further mounted thereon. Wiring between the CHIP2 mounted on the top and the CHIP1 is conducted by a PATH7. For wiring between the CHIP2 and the board, a PATH8 is used. Owing to this mounting method, three chips can be stacked and consequently the mounting area of the memory module can be made smaller. As for the connection between the CHIP2 and the board, signals can be relayed by using a PATH5 and the PATH7 to effect the connection, besides using the wiring PATH8. In the case where the relay wiring method is used especially for wiring of signals used in common by the CHIP1 and CHIP2, the number of wires can be reduced and consequently the bonding process can be simplified.

Figure 21A:
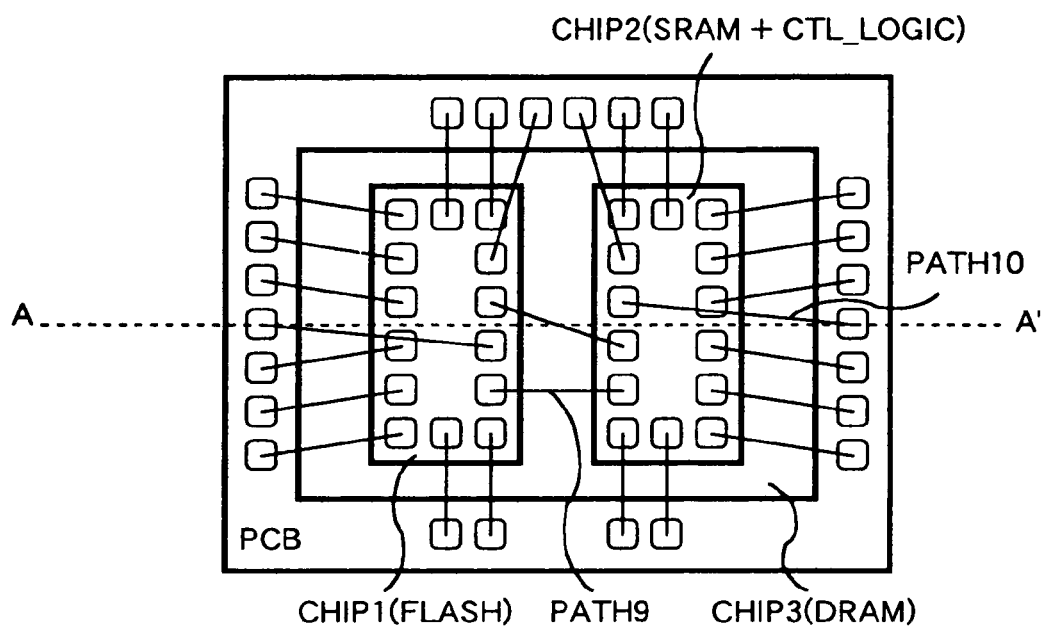
FIGS. 21A and 21B are diagrams showing an example of a mounting form of a memory module according to an embodiment of the present invention.
Figure 21B:
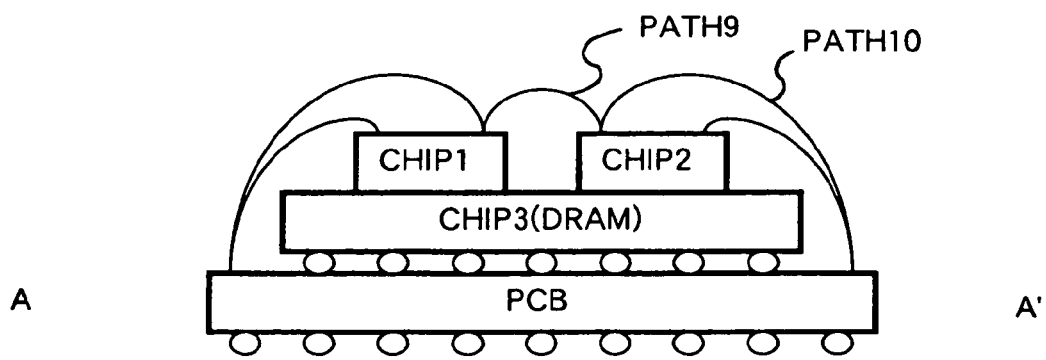

FIGS. 21A and 21B show a variation example of FIGS. 16A and 16B of the memory module according to an embodiment of the present invention. FIG. 21A shows a top view, and FIG. 21B shows a sectional view. In this example, a CHIP3 is mounted on a board by using the ball grid array. A CHIP1 and a CHIP2 are further mounted thereon. For wiring between the CHIP1 and the CHIP2, a PATH9 is used. Furthermore, for wiring between boding pads located on the CHIP1 and the CHIP2 and on the center side of the module and the board, PATHs 10 are used.

Especially in the case where the area of the CHIP3 is large, the present mounting method is effective in reducing the mounting area of the module. Since the CHIP3 is connected to the board by using the BGA, the density of wiring using the bonding can be lowered and consequently the wiring process can be simplified. Furthermore, on the CHIP1 and the CHIP2 mounted on the same CHIP3, bonding pads can be easily aligned in height. Since the wiring PATH9 between the CHIP1 and the CHIP2 can thus be provided simply, the wiring process can be simplified. By using the PATHs 10, the wiring between wiring pads located on the CHIP1 and the CHIP2 and on the center side of the module and the board can be provided. Furthermore, since the CHIP1 and the CHIP2 are disposed on the same surface of the CHIP3, the height of the module becomes uniform. As a result, a stronger sealing member or package can be implemented.

Figure 22A:
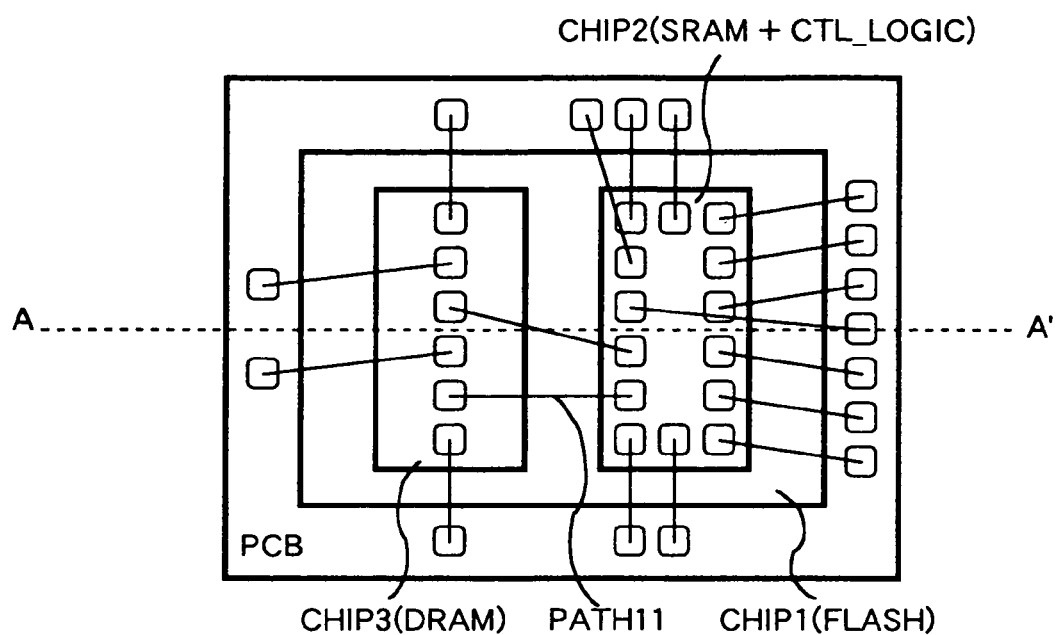
FIGS. 22A and 22B are diagrams showing an example of a mounting form of a memory module according to an embodiment of the present invention.
Figure 22B:
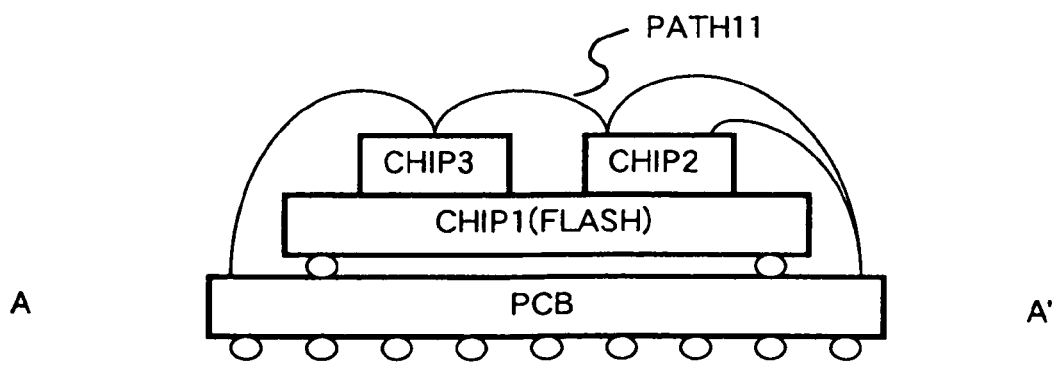

FIGS. 22A and 22B show a variation example of FIGS. 16A and 16B of the memory module according to an embodiment of the present invention. FIG. 22A shows a top view, and FIG. 22B shows a sectional view. In this example, a CHIP1 is mounted on a board by using the ball grid array. A CHIP2 and a CHIP3 are further mounted thereon. By wiring PATH11, wiring between the CHIP3 and the CHIP2 of the LOC form can be provided.

Especially in the case where the area of the CHIP1 is large, the present mounting method is effective in reducing the mounting area of the module. Since the CHIP1 is connected to the board by using the BGA, the density of wiring using the bonding can be lowered and consequently the wiring process can be simplified. Furthermore, on the CHIP3 and the CHIP2 mounted on the same CHIP1, bonding pads can be easily aligned in height. The wiring PATH11 between the CHIP3 and the CHIP2 can thus be provided simply. By using the wiring PATH 11, the wiring between wiring pads located on the CHIP2 and on the center side of the module and the CHIP3 can be provided. Furthermore, since the CHIP1 and the CHIP2 are disposed on the same surface of the CHIP3, the height of the module becomes uniform. As a result, a stronger sealing member can be implemented.

Figure 23A:
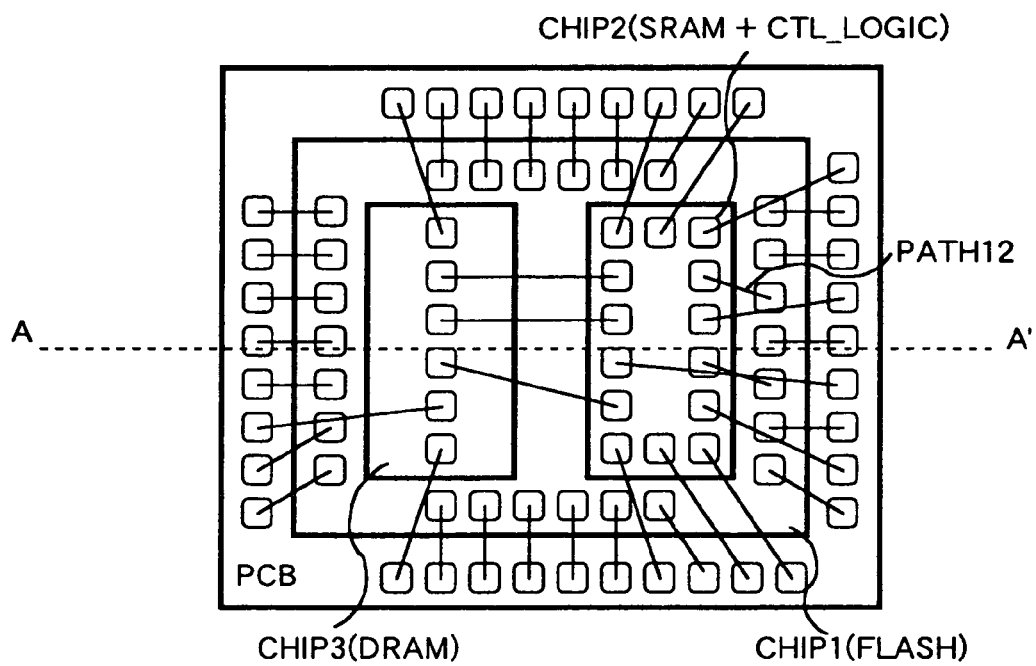
FIGS. 23A and 23B are diagrams showing an example of a mounting form of a memory module according to an embodiment of the present invention.
Figure 23B:
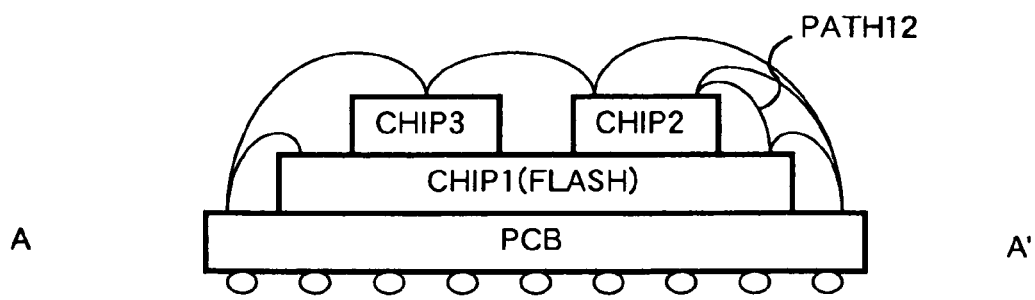

FIGS. 23A and 23B show a memory module according to an embodiment of the present invention. FIG. 23A shows a top view, and FIG. 23B shows a sectional view. In this example, a CHIP1 is first mounted on a board. A CHIP2 and a CHIP3 are further mounted thereon. By wiring PATH12, wiring between the CHIP1 and the CHIP2 can be provided.

Especially in the case where the area of the CHIP1 is large, the present mounting method is effective in reducing the mounting area of the module. Since every wiring is unified to bonding, the fabrication process of the board is simplified. Furthermore, on the CHIP3 and the CHIP2 mounted on the same CHIP1, bonding pads can be easily aligned in height.

The wiring between the CHIP3 and the CHIP2 can thus be provided simply. By using the wiring PATH 12, the wiring between the CHIP1 and the CHIP2 can be provided. Especially in the case where the wiring PATH 12 is used for wiring of signals used in common by the CHIP1 and the CHIP2, the number of wires can be reduced and consequently the bonding process can be simplified, as compared with the case where respective wires are connected from the board. Furthermore, since the CHIP1 and the CHIP2 are disposed on the same surface of the CHIP3, the height of the module becomes uniform. As a result, a stronger sealing member can be implemented.

The following effects are brought about by the embodiments of the present invention heretofore described. First, by controlling access to the DRAM with the controller, a large capacity memory that need not be refreshed from the outside is implemented. Secondly, by setting a data retention area and a work area and conducting power supply control of them, a memory module with a reduced data retention current is implemented. Thirdly, by mounting a plurality of semiconductor chips in one sealing member, a memory module having a small mounting area can be provided.

What is claimed is:

1. A semiconductor device comprising:
   a first memory array including a plurality of dynamic type memory cells; and
   a memory controller receiving signals using a SRAM system and accessing the first memory array by converting the signals,
   wherein the memory controller has a temperature measuring module and changes a refresh interval of the first memory array according to the temperature detected by the temperature measurement module.

2. A semiconductor device according to claim 1,
   wherein the memory controller further has a refresh counter,
   wherein the refresh counter generates a refresh address according to the refresh interval of the first memory array and changes the refresh interval in response to an output signal of the temperature measuring module.

3. A semiconductor device according to claim 1,
   wherein the memory controller and first memory array are formed on a chip.

4. A semiconductor device according to claim 2,
   wherein the memory controller further has an address transition detector circuit detecting transitions in the address signals and the command signals and outputting a pulse indicating the transitions in the address signals and an access controller converting a received address to an address for the first memory array and outputting the address for the first memory array to the first memory array.

5. A semiconductor device according to claim 1, further comprising:
   a second memory array including a plurality of static type memory cells,
   wherein the first memory array, the second memory array, and the memory controller are incorporated into a package.

6. A semiconductor device according to claim 5,
   wherein the memory controller and first memory array are formed on a chip.

* * * * *